(12) United States Patent
Voutilainen et al.

(10) Patent No.: US 9,319,043 B2
(45) Date of Patent: Apr. 19, 2016

(54) GENERATION OF DIFFERENTIAL SIGNALS

(75) Inventors: Martti Kalevi Voutilainen, Espoo (FI);
Pirjo Marjaana Pasanen, Helsinki (FI);
Markku Anttoni Oksanen, Helsinki (FI); Eira Tuulia Seppälä, Helsinki (FI);
Vladimir Alexsandrovich Ermolov, Espoo (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 13/576,147

(22) PCT Filed: Feb. 2, 2010

(86) PCT No.: PCT/IB2010/050450
§ 371 (c)(1),
(2), (4) Date: Jan. 24, 2013

(87) PCT Pub. No.: WO2011/095840
PCT Pub. Date: Aug. 11, 2011

(65) Prior Publication Data
US 2013/0194005 A1 Aug. 1, 2013

(51) Int. Cl.
*H03B 1/00* (2006.01)
*H03K 3/00* (2006.01)
(Continued)

(52) U.S. Cl.
CPC ............... *H03K 17/16* (2013.01); *H01P 1/203* (2013.01); *H04L 25/0272* (2013.01); *H04L 25/0276* (2013.01)

(58) Field of Classification Search
CPC ............... H03K 17/04; H03K 17/041; H03K 17/04106; H03K 17/16; H03K 17/161; H03K 17/162; H03K 19/018514; H01P 1/201; H01P 1/203; H01P 1/20309; H04L 25/026; H04L 25/0264; H04L 25/0272; H04L 25/0276; H04L 25/028

USPC .............. 327/108–112, 423–437; 326/82, 83; 333/32
See application file for complete search history.

(56) References Cited

U.S. PATENT DOCUMENTS 6,590,432 B1 * 7/2003 Wu et al. .................... 327/108
6,894,536 B2 5/2005 Martin et al.
(Continued)

FOREIGN PATENT DOCUMENTS

CN 1707871 A 12/2005
CN 101132168 A 2/2008
(Continued)

OTHER PUBLICATIONS

Wu, Shu-Jung, et al., "A Novel HU-shaped Common-mode Filter for GHz Differential Signals", IEEE, 2008.*
"Better Control of Carbon Nanotube 'Growth' Promising for Future Electronics", Purdue University News, Retrieved on Jul. 31, 2013, Webpage available at : http://news.uns.purdue.edu/x/2009b/091001StachNanotubes.html.
(Continued)

*Primary Examiner* — Lincoln Donovan
*Assistant Examiner* — Thomas Skibinski
(74) *Attorney, Agent, or Firm* — Mintz Levin Cohn Ferris Glovsky and Popeo, P.C.

(57) ABSTRACT

The invention relates to an apparatus comprising a differential driver module configured to generate at least one differential signal having steep rise and fall times for at least partially reducing common-mode noise. The invention also relates to a method for causing the differential driver to generate the signal and a system comprising the differential driver and a conductor module for transmission of the generated differential signal. A computer program for performing the method and a computer-readable medium is also part of the invention.

25 Claims, 17 Drawing Sheets

(51) Int. Cl.
*H03K 17/16* (2006.01)
*H04L 25/02* (2006.01)
*H01P 1/203* (2006.01)

(56) References Cited

U.S. PATENT DOCUMENTS

| | | | |
|---|---|---|---|
| 7,157,990 B1* | 1/2007 | Adam et al. | 333/186 |
| 7,301,109 B2 | 11/2007 | Chen | |
| 2003/0107411 A1* | 6/2003 | Martin et al. | 327/100 |
| 2005/0270017 A1 | 12/2005 | Du et al. | |
| 2005/0270117 A1 | 12/2005 | Tomonari et al. | |
| 2008/0204080 A1* | 8/2008 | Yoon et al. | 326/93 |
| 2008/0219359 A1 | 9/2008 | Salomon | |
| 2009/0153219 A1* | 6/2009 | Wu et al. | 327/333 |
| 2009/0296830 A1 | 12/2009 | Suzuki et al. | |
| 2010/0109794 A1* | 5/2010 | Groepl et al. | 333/32 |
| 2010/0231266 A1 | 9/2010 | Kishor | |

FOREIGN PATENT DOCUMENTS

| | | |
|---|---|---|
| CN | 101411149 A | 4/2009 |
| CN | 101594158 A | 12/2009 |
| JP | 2007-234500 A | 9/2007 |
| JP | 2007234500 A | 9/2007 |
| WO | 2009/007464 A1 | 1/2009 |
| WO | WO 2009007464 A1 * | 1/2009 |
| WO | WO-2009007464 A1 | 1/2009 |

OTHER PUBLICATIONS

Liu et al., "An Embedded Common-Mode Suppression Filter for GHz Differential Signals Using Periodic Defected Ground Plane", IEEE Microwave and Wireless Components Letters, vol. 18, Issue 4, Apr. 2008, pp. 248-250.

Rutherglen et al., "Nanoelectromagnetics: Circuit and Electromagnetic Properties of Carbon Nanotubes", Small, vol. 5, Issue 8, Apr. 2009, pp. 884-906.

Wu et al., "A Novel Wideband Common-Mode Suppression Filter for Gigahertz Differential Signals Using Coupled Patterned Ground Structure", IEEE Transactions on Microwave Theory and Techniques, vol. 57, Issue 4, Apr. 2009, pp. 848-855.

Ha et al., "Soft Magnetic Co—Fe—Al—O Thin Films for Ultrahigh Frequency Applications", Physica Status Solidi, vol. 201, Issue 8, Jun. 2004, pp. 1905-1908.

International Search Report and Written Opinion received for corresponding International Patent Application No. PCT/IB2010/050450, dated Dec. 1, 2010, 22 pages.

Wu et al., "A Novel Wideband Common-Mode Suppression Filter for Gigahertz Differential Signals Using Coupled Patterned Ground Structure", IEEE Transactions on Microwave Theory and Techniques, vol. 57, No. 4, Apr. 2009.

Wu, et al., "A Novel HU-shaped Common-mode Filter for GHz Differential Signals", IEEE International Symposium on Electromagnetic Compatibility, 2008.

* cited by examiner

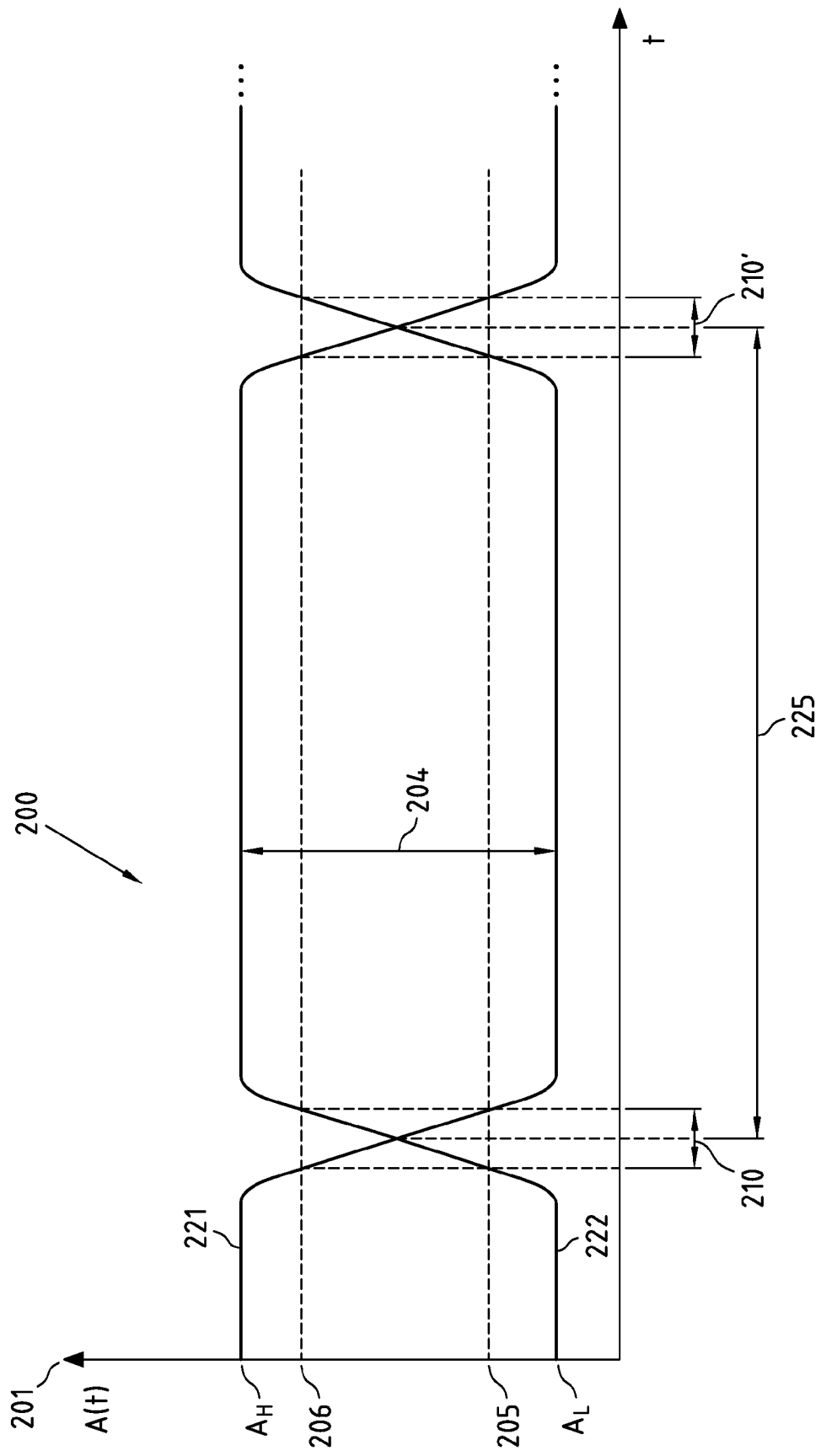

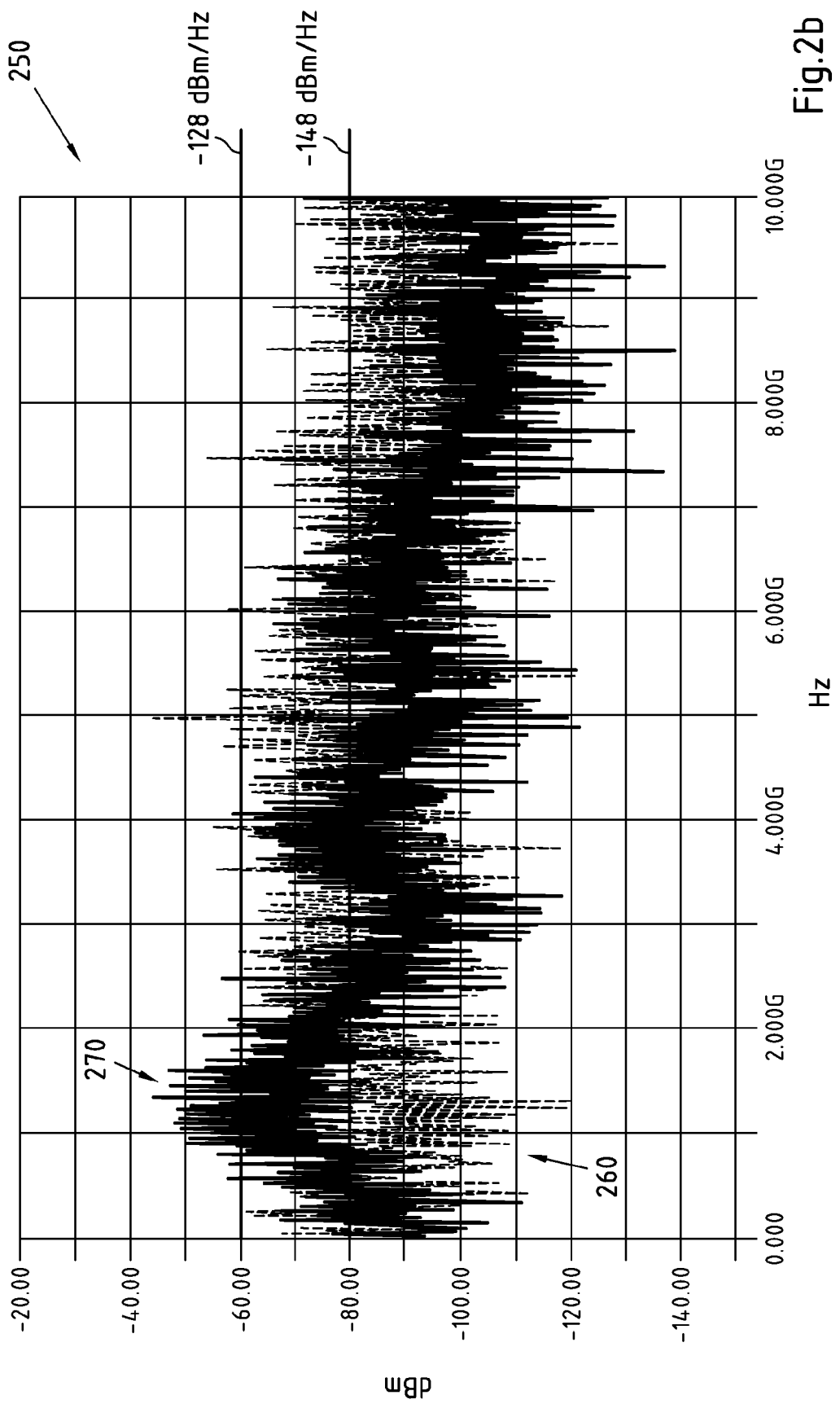

GENERATION OF DIFFERENTIAL SIGNALS

RELATED APPLICATION

This application was originally filed as PCT Application No. PCT/IB2010/050450 filed Feb. 2, 2010.

FIELD

This invention relates to a differential driver module for generating at least one differential signal.

BACKGROUND

Transmission of information in mobile phones, mobile terminals, smartphones, personal digital assistants and mobile computers between integrated circuits (IC) inside a single functional module and between different functional parts like display and application processor may today be handled using wires in printed wiring boards (PWB), micro coaxial cables (MXC) and flat flexible cables called Flexible Printed Circuits (FPC) boards.

In modern ICs the bit rates have been increased from below 10 Mbps in a single signal wire used for complementary metal oxide semiconductor (CMOS) single-ended signalling, to up to 1 Gbps on one differential pair. For instance, in the near feature bit rates will be up to 6 Gbps with the Mobile Industry Processor Interface (MIPI) Unified Protocol (UniPro) using M-PHY (serial interface technology with high bandwidth capabilities). Also universal serial bus version 3.0 (USB3) and high-definition multimedia interface (HDMI) interfaces use above 1 Gbps bit rates.

When the bit rate is in the gigabits per second area, the signals generate electromagnetic interference to the cellular receivers which are operating in the same frequency area.

SUMMARY

In a first aspect of the present invention, a method is disclosed, comprising causing a differential driver module to generate at least one differential signal having steep rise and fall times.

In this first aspect of the present invention, furthermore a computer program is disclosed, comprising program code for performing the method according to the first aspect of the present invention when the computer program is executed on a processor. The computer program may for instance be distributable via a network, such as for instance the Internet. The computer program may for instance be storable or encodable in a computer-readable medium. The computer program may for instance at least partially represent software and/or firmware of the processor.

In this first aspect of the present invention, furthermore a computer-readable medium is disclosed, having a computer program according to the first aspect of the present invention stored thereon. The computer-readable medium may for instance be embodied as an electric, magnetic, electro-magnetic, optic or other storage medium, and may either be a removable medium or a medium that is fixedly installed in an apparatus or device. Non-limiting examples of such a computer-readable medium are a Random-Access Memory (RAM) or a Read-Only Memory (ROM). The computer-readable medium may for instance be a tangible medium, for instance a tangible storage medium. A computer-readable medium is understood to be readable by a computer, such as for instance a processor.

In this first aspect of the present invention, furthermore an apparatus is disclosed, comprising a differential driver module configured to generate at least one differential signal having steep rise and fall times.

In this first aspect of the present invention, furthermore an apparatus is disclosed, comprising at least one processor; and at least one memory including computer program code, the at least one memory and the computer program code configured to, with the at least one processor, cause the apparatus at least to generate at least one differential signal having steep rise and fall times.

The computer program code included in the memory may for instance at least partially represent software and/or firmware for the processor. Non-limiting examples of the memory are a RAM or ROM that is accessible by the processor.

In this first aspect of the present invention, furthermore an apparatus is disclosed, comprising a differential driver means for generating at least one differential signal having steep rise and fall times.

The apparatuses may for instance be portable electronic devices, such as for instance mobile phones, mobile terminal, smartphone, personal digital assistants or media-rendering devices.

For instance, the steep rise and fall times may be used for at least partially reducing common-mode noise.

Steep rise and fall times of a differential signal of the at least differential signal may be understood to represent rise and fall times being short compared with the cycle time of the respective differential signal.

The apparatus comprises a differential driver module which is configured to generate at least one differential signal having steep rise and fall times.

For instance, the differential driver module may be applied for a serial or parallel data transmission, wherein the at least one differential signal is used for this data transmission. Each of the at least one differential signal comprises two paired signals representing two substantially complementary signals. For instance, each of the two paired signals of the differential signal may be configured to be transmitted via a differential signal wire pair. The differential driver module may be configured to provide a substantially matching of amplitude, timing and rise/fall times for each of the two paired signals.

Common-mode noise may be generated from timing and/or amplitude differences between two paired signals of the at least one differential signal. For instance, common-mode noise may be caused by the unbalance in differential signal lines. As an example, common-mode noise may be considered as a kind of crosstalk interference resulting from similar currents flowing in the same direction in nearby wires or strips for transmitting two paired signals of the at least one differential signal.

Due to generating at least one differential signal having steep rise and fall times common-mode noise may be effectively removed or at least partially reduced, because when rise/fall times are short timing differences between two paired signals are reduced.

Furthermore, for instance, due to generating at least one differential signal having steep rise and fall times complicated rise/fall time matching circuits may be not be necessary.

The rise time may refer to the time required for a signal to change from a specified low value to a specified high value and the fall time may refer to the time required for a signal to change from a specified high value to a specified low value.

For instance, the differential driver module may represent a circuitry, for example implemented in an integrated circuit (IC). As an example, a CMOS technology may be used for this IC, but any other well-suited technology may also be used. Under the non-limiting example of CMOS, for instance, a CMOS 65 nanometer (nm) technology or a smaller technology, for example 45 nm technology or less than 45 nm, may be used for implementing the differential driver module in order to generate steep rise and fall times. Any CMOS technology enabling a differential driver module to generate at least one differential signal having steep rise and fall times may be applied. For instance, the rise and fall time provided by the differential driver module may be limited only by the used semiconductor technology.

As an example, the common-mode noise may be reduced at least partially in frequency bands related to wireless and/or cellular communication systems, for example 2G, 3G or 4G mobile communications systems, or related to any other radio frequency communications systems. For instance, the common-mode noise may be reduced at least partially at frequencies less than 3 GHz.

Thus, distortion of cellular receiver bands may be reduced by means of the steep rise and fall times. For instance, this may hold for any of the presented example embodiments.

According to an example embodiment of the first aspect of the present invention, said rise and fall times are less than 35 ps.

According to an example embodiment of the first aspect of the present invention, said rise/fall times are in one range from the following ranges:
  10 to 30 ps;
  10 to 20 ps;
  5 to 20 ps; and
  0 to 15 ps.

For instance, choosing a well-suited range may depend on an applied technology for implementing the differential driver module in an IC, and/or it may depend on generated noise in high frequency ranges. As an example, these high frequency ranges may represent frequencies greater than 3 GHz, for example greater than 5 GHz or greater than 7 GHz, or, for instance, these high frequency ranges may represent much higher frequencies. According to an embodiment of the first aspect of the present invention, said differential signal is configured to be used at least for one from:
  a serial digital data transmission; and
  a parallel digital data transmission.

As an example, the digital data transmission may represent a data transmission with a minimum data rate greater than 300 Kbit/s, for example the digital data transmission may represent a Gbit/s data transmission. For instance, the digital data transmission may be based on the Mobile Industry Processor Interface (MIPI) Unified Protocol (UniPro) using M-PHY, or it may represent a USB data transmission, for example USB Version 3.0 or any other USB Version, or based on HDMI or it may represent any other Gbit/s data transmission, for example a serial digital transmission or a parallel digital transmission like a serial link or a parallel link.

According to an example embodiment of the first aspect of the present invention, said digital data transmission represents a data transmission with a maximum data rate less than at least one of the following data rates:
  2 Gbit/s per differential signal of the at least one differential signal;
  4 Gbit/s per differential signal of the at least one differential signal;
  6 Gbit/s per differential signal of the at least one differential signal; and
  8 Gbit/s per differential signal of the at least one differential signal.

According to an example embodiment of the first aspect of the present invention, a ratio between the rise time or the fall time and a cycle time of at least one differential signal of the at least one differential signal is less than:
  10 percent;
  8 percent;
  5 percent; and
  1 percent.

Thus, the ratio between the rise time of a respective differential signal of the at least one differential signal and the cycle time of this respective differential signal may be less than one of the above-stated ratios and the ratio between the fall time and the cycle time of the respective differential signal may be less than one of the above-stated ratios.

The cycle time associated with a respective differential signal of the at least one signal may be associated with a symbol rate or binary data rate of the respective differential signal. For instance and as a non-limiting example, in case a binary data rate is 1 Gbit/s the cycle time would be 1 nanosecond (ns). Or, as another non-limiting example, in case a binary data rate is 100 Gbit/s the cycle time would be 10 picoseconds (ps).

Due to these ratios being less than the above-stated values, the rise and fall times are short compared to the cycle time of the respective differential signal. Thus, common-mode nose caused by this respective differential signal may be reduced compared to differential signals having slower rise and fall times.

According to an embodiment of the first aspect of the present invention, the apparatus is a mobile terminal.

For instance, this mobile terminal may represent a mobile phone or a personal digital assistants or any other mobile electronic device.

For instance, the mobile phone may represent a 2G, 3G or 4G or any other well-suited mobile phone.

According to an embodiment of the first aspect of the present invention, the differential driver module is configured to be connected with at least two transmission lines for transmitting the at least one differential signal.

For instance, each of the at least one differential signal may be represented by a first signal component and a second signal component, wherein the first signal component is substantially complementary to the respective second component associated with the same differential signal of the at least one differential signal, and wherein a first and second signal component associated the same differential signal of the at least one differential signal represent two paired signals which are transmitted via two paired transmission lines of the at least two transmission lines.

As an example, these at least two transmission lines may represent wires or strip lines, for example micro strip lines.

For instance, the at least two transmission lines may be configured to attenuate noise generated by fast edges of the differential signal by means of dielectric and/or skin effect losses. For instance, this noise may represent high frequency noise, for example in frequencies greater than 3 GHz.

For instance, the at least two transmission lines may extend only in the apparatus. As an example, this may be used for an interconnection between different modules inside the apparatus. But, for instance, the at least two transmission lines may be located outside the apparatus. As an example, this may be used for connecting the apparatus with another apparatus. In this example, for instance, the apparatus may comprise a kind of interface and/or connector configured to be connected with the at least two transmission lines.

Furthermore, for instance, the at least two transmission lines may extend from the inside to the outside of the apparatus.

According to an example embodiment of the first aspect of the present invention, the apparatus comprises at least two switching modules, wherein each differential signal of the at least one differential signal is associated with respective two switching modules of the at least two switching modules, wherein each of two switching modules associated with a respective differential signal is configured to be connected with a respective transmission line of the at least two transmission lines in order to switch a signal of the respective transmission line in accordance with the respective differential signal.

Each of two switching modules associated with a respective differential signal of the at least one differential signal may be considered as a pair of switching modules.

Furthermore, as an example, each of the switching modules may be controlled by the above-mentioned processor.

One switching module of a pair of switching modules may be configured to output a first signal component of the respective differential signal and the remaining switching module of the pair of switching modules may be configured to output a second signal component of the respective differential signal. Thus, the first signal component and the second signal component represent one of the two paired signals representing a respective differential signal of the at least one differential signal.

The first signal component may be transmitted via a first transmission line of two paired transmission lines and the second signal component may be transmitted via a second transmission line of the same two paired transmission lines.

For instance, the differential driver module may represent a current-mode differential driver module, wherein the apparatus or the differential driver module may comprise an optional current source, and wherein each of the switching modules is configured to connect or disconnect the current source with the respective transmission line of the at least two transmission lines in response to the data to be transmitted by means of the respective differential signal.

For instance, the differential driver module may represent a voltage-mode differential driver module, wherein the apparatus or the differential driver module may comprise an optional voltage source, and wherein each of the switching modules is configured to connect or disconnect the voltage source with the respective transmission line in response to the data to be transmitted by means of the respective differential signal. As an example, the voltage source may comprise a switched capacitor regulator which is configured to output a predefined voltage. Furthermore, for instance, the voltage-mode differential driver module may enable reduced power-consumption.

According to an example embodiment of the first aspect of the present invention, the differential driver module represents a voltage-mode differential driver module, wherein each of the at least two switching modules comprises a pull-up switch and a pull-down switch.

For instance, each of the pull-up switches of a switching module may be configured to pull-up the respective signal component of the respective differential signal associated with the switching module. Furthermore, each of the pull-down switches of a switching module may be configured to pull-down the respective signal component of the respective differential signal associated with the switching module. For instance, pull-up may understood that a first voltage level, which may be provided by a voltage source may be connected with the transmission line of the respective signal component by means of switching the respective pull-up switch. Furthermore, for instance, pull-down may be understood that a second voltage level, which is less than the first voltage level, may be connected with the transmission line of the respective signal component by means of switching the respective pull-down switch. As an example, this second voltage level may represent a ground level.

For instance, the apparatus may comprise a controller which is configured to control the pull-up switches and the pull-down switches of a pair of switching modules in order to switch the pull-up switches and pull-down switches in accordance with data of the respective differential signal. For instance, this controller may be the above-mentioned processor.

According to an example embodiment of the first aspect of the present invention, each of the pull-up switches and pull-down switches have an impedance in the range from 40 to 60 ohm when closed.

As a non-limiting example, this impedance may be approximately 50 ohm. As an example, each of the pull-up switches and each of the pull-down switches may comprise an optional resistor in order to reach the impedance in above mentioned range.

According to an example embodiment of the first aspect of the present invention, each of the pull-up switches and pull-down switches comprises a transistor.

For instance, the transistors may represent very low-impedance large transistors. As an example, the transistors may represent fast transistors or the fastest possible transistors available in the respective technology. For instance, the transistors may represent CMOS transistors.

Furthermore, for instance, each of the transistors may be controlled by a driver. For instance, this driver may represent a fast CMOS driver.

According to an example embodiment of the first aspect of the present invention, each of the pull-up switches and pull-down switches comprises a resistor placed in series with the respective transistor.

For instance, each of the pull-up switches and each of the pull-down switches may comprise a transistor and an optional additional resistor placed in series with the respective transistor. As an example, under the non-limiting assumption of CMOS technology, the resistors may represent polysilicon resistors.

According to an example embodiment of the first aspect of the present invention, at least one of the pull-up switches and pull-down switches comprises a resonance tunnel diode.

The resonance tunnel diode may be used to increase timing of the respective pull-up or pull-down switch.

According to an example embodiment of the first aspect of the present invention, the apparatus comprises at least one first type pre-driver and at least one second type pre-driver, wherein each of two switching modules associated with a respective differential signal is associated with a respective first type pre-driver of said at least one first type pre-driver and with a second type pre-driver of said at least one second type pre-driver, said respective first type pre-driver being configured to control the pull-up switch of a first switching module of the respective two switching modules and the pull-down switch of a second switching module of the respective two second switching modules, and said respective second type pre-driver being configured to control the pull-down switch of the first switching module of the respective two switching modules and the pull-up switch of the second switching module of the respective two second switching modules.

For instance, each of the first type pre-drivers and each of the second type pre-drivers may be controlled by means of the above mentioned processors.

For instance, the first type pre-driver may represent an inverting pre-driver and the second type pre-driver may represent a non-inverting pre-driver. As another non-limiting example, the first type pre-driver may represent a non-inverting pre-driver and the second type pre-driver may represent an inverting pre-driver.

For instance, the first type pre-driver and the second type pre-driver may represent pre-drivers with fast edges, for example they may represent pre-drivers with the fastest possible edges available in the respective technology.

The first type pre-driver is configured to control the pull-up switch of a first switching module of the respective two switching modules and the pull-down switch of a second switching module of the respective two second switching modules, and the second type pre-driver is configured to control the pull-down switch of the first switching module of the respective two switching modules and the pull-up switch of the second switching module of the respective two second switching modules.

Thus, for instance, the data associated with the respective differential signal associated with the two switching modules may control the first type pre-driver and the second type pre-driver in order to perform switching of the switching modules, wherein the pull-up switch and the pull-down-switch in one of the respective two switching module are switched in the opposite direction.

According to an example embodiment of the first aspect of the present invention, the apparatus comprises at least one filter module configured to at least partially filter out noise generated by said at least one differential signal.

For instance, this noise may include common-mode noise due to the transmission of the at least one differential signal generated by the differential driver module. For instance, this noise may include noise generated by the fast edges of the differential signal having said fast rise and fall times.

As an example, at least one of said at least one filter module may be configured to at least partially filter out frequencies greater than 2.5 GHz and/or greater than 3 GHz. Thus, noise generated by the fast edges of the differential signal may be reduced at least partially by means of this filtering.

For instance, at least one of the at least one filter module may comprise a high-pass filter which may be connected or coupled to ground in order to couple high-frequency noise at least partially to ground.

Or, as another example, at least one of the at least one filter module may comprise a bandpass filter which may be connected or coupled to ground in order to couple noise in the frequency range of the bandpass filter at least partially to ground. For instance, this frequency range may represent a frequency range greater than 2.5 GHz and/or greater than 3 GHz. Furthermore, this frequency range may depend on a wireless transmission band. For instance, this bandpass filter may comprise a resonance filtering structure.

As an example, one of the at least one filter module may be located at an output of the differential driver module inside apparatus, wherein this output may be configured to output the at least one differential signal. Thus, noise can be reduced at the output of the differential driver module. For instance, the filter module may extend towards the beginning of the at least two transmission lines at this output.

According to an example embodiment of the first aspect of the present invention, at least one of said at least one filter module is configured to at least partially filter out frequencies greater than 2.5 GHz.

At least one of the at least on filter module may be configured to at least partially filter out frequencies greater than 3 GHz.

According to an example embodiment of the first aspect of the present invention, at least one of said at least one filter module comprises a resonance filtering structure.

For instance, this resonance filtering structure may be connected or coupled to ground and may represent a bandpass filter.

According to an example embodiment of the first aspect of the present invention, at least one of said at least one filter module comprises a defected ground structure filter.

Each of at least one filter module of the at least one filter module may comprise ground structure representing a ground layer or ground film or ground plane comprising defects. The ground structure may be connected or coupled to a ground potential. The defects in the ground structure may be arranged to enable the desired filter characteristic, wherein each of the above mentioned filter characteristics may be applied.

As a non-limiting example, the ground structure with defects may form a resonance circuit that is configured to at least partially prevent high-frequency noise generated by the at least one differential signal pass into the at least two transmission lines.

For instance, the ground structure may be conductive, for example the material may be copper or silver or any other conductive material.

Furthermore, for instance, the conductive material may represent a frequency-dependent conductive material providing increased conductivity at increased frequencies. Thus, higher frequencies may be filtered out in a better way than lower frequencies by means of this frequency-dependent conductive material.

As a non-limiting example the ground structure may represent a high-permittivity and high-permeable material. For instance, as a non-limiting example, the product of relative permeability and permittivity of the material may be at least 5000 at the frequencies to be filtered, for example this product may be at least 10000 at the frequencies to be filtered.

For instance, the material of ground structure may be a carbon nanotube (CNT) structure/film, or any other structure or film, for example a CoFeAlO film, having high electromagnetic losses. CNT may be a mixture of dense and entangled nanotube networks and epoxy, polymethyl methacrylate (PMMA) or other similar material. Thus, noise in higher frequency ranges may be attenuated effectively by means of these materials. Using CNT network/structure/film, for instance, may reduce the size the ground structure by applying the property that electrons may travel at 1/300 speed of light in CNTs.

According to an example embodiment of the first aspect of the present invention, said at least one defected ground structure comprises periodic defects in a ground plane configured to create a bandpass filter.

According to an example embodiment of the first aspect of the present invention, the material of the at least one defected ground structure filter has a product of relative permeability and permittivity of one of the following:
at least 5000 at the frequencies to be filtered out; and
at least 10000 at the frequencies to be filtered out.

According to an example embodiment of the first aspect of the present invention, the material of the at least one defected ground structure filter may comprise carbon nanotubes or CoFeAlO.

For instance, the shielding structure could be CNT film, or bucky paper, or other film having high electromagnetic loss. For example nickel-based material may be used.

According to an example embodiment of the first aspect of the present invention, the differential driver is implemented in an integrated circuit and at least one of said at least one filter module is located in the integrated circuit module.

Thus, noise may be attenuated inside the IC.

As an example, a CMOS technology may be used for this IC module, but any other well-suited technology may also be used. Under the non-limiting example of CMOS, for instance, a CMOS 65 nanometer (nm) technology or a smaller technology, for example 45 nm technology or less than 45 nm, may be used for implementing the differential driver module in order to generate steep rise and fall times. Any CMOS technology enabling a differential driver module to generate at least one differential signal having steep rise and fall times may be applied. For instance, the rise/fall time provided by the differential driver module may be limited only by the used semiconductor technology.

According to a second aspect of the present invention, a system is disclosed, the system comprising:
 an apparatus according to one of the presented apparatuses; and
 a connector module comprising the at least two transmission lines, the connector module being configured to be connected to the apparatus.

The differential driver module is configured to be connected to the at least two transmission lines. The apparatus may comprise an interface/connector in order to receive the at least one differential signal from the differential driver module. Furthermore, the interface/connector may be configured to be connected with the conductor module, wherein conductor module comprises the at least two transmission lines. Thus, the apparatus may be configured to be connected with another apparatus by means of the conductor module.

The conductor module may represent any kind of cable. For instance, it may be flexible. As a non-limiting example, the conductor module may represent a printed wiring board (PWB), micro coaxial cable (MXC) or a flat flexible cable called Flexible Printed Circuits (FPC) boards. Several examples of embodiments of this conductor module will be given in the sequel.

According to an example embodiment of the second aspect of the present invention, the connector module comprises at least one filter module configured to at least partially filter out noise generated by said at least one differential signal.

This at least one filter module may be based on any one of the at least one filter modules explained above.

At least one of the at least one filter module may be placed at one end of conductor module in an area near to the interface and/or connector, when conductor module connects to the interface and/or connector. Thus, noise can be filtered out when the differential signal to be transmitted enters the conductor module.

For instance, at least one of the at least one filter module may be placed under and/or above the at least two transmission lines.

According to an example embodiment of the second aspect of the present invention, said conductor module is flexible.

For instance, the conductor module may represent a flexible cable.

According to an example embodiment of the second aspect of the present invention, said at least two transmission lines of said at least two transmission lines are arranged as coplanar lines.

For instance, two transmission lines associated with the same differential signal may be arranged in a tight distance so that these two transmission lines are relatively tightly coupled. This may prevent that differential signalling fields extend considerably into optional ground layers.

This coupling may represent the electromagnetic coupling between two transmission lines associated with the same differential signal. Furthermore, in case the conductor module comprises at least one optional ground line, the differential signal's electromagnetic fields may be kept near the at least two transmission lines and the optional ground lines. For instance, two transmission lines associated with the same differential signal may represent coplanar transmission lines.

According to an example embodiment of the second aspect of the present invention, said at least two transmission lines are strip lines.

For instance, these strip lines may represent micro strip lines. As a non-limiting example, the cross-section of these strip lines may have a rectangular form. Other forms may also be used.

According to an example embodiment of the second aspect of the present invention, said strip lines comprise one of the following materials:
 copper;
 aluminium; and
 carbon nanotubes.

According to an embodiment of the second aspect of the present invention, the connector module comprises a dielectric layer, wherein said at least two transmission lines are embedded in this dielectric layer.

This dielectric layer may provide >1 relative permittivity. For instance, the dielectric layer may provide high permittivity.

Furthermore, the dielectric layer material may be flexible. This may enable the conductor module to be bendable. For instance, the conductor module may represent a printed circuit board. As an example, the conductor module may represent a flexible printed circuit cable. Furthermore, the dielectric layer may at least partially represent foam dielectric, for example Teflon® foam by Gore, but any other well-suited foam dielectric may also be used. This may increase flexibility.

For instance, said at least two transmission lines may be at least partially embedded in the dielectric layer or they may be embedded completely in the dielectric layer.

According to an example embodiment of the second aspect of the present invention, the connector module comprises at least one of:
 a ground layer deposited on an upper surface of the dielectric layer; and
 a ground layer deposited on a lower surface of the dielectric layer.

As a non-limiting example, the ground plane may be composed of silver paste painting, copper paste painting, copper-silver hybrid paste panting, or any another conductive painting.

The at least one ground layer may be so close to the at least two transmission liens that a common-mode component of the at least one differential signal may use at least one of the at least one ground layer as return current path. Thus, common-mode components of the at least one differential signal may be attenuated by means of the ground layer acting a return current path.

For instance, at least one of the at least one ground layer may not be used as return current path for differential signalling. The resistivity of the ground layer may be relatively large.

According to an example embodiment of the second aspect of the present invention, the at least one of the at least one ground layer comprises at least one defected ground structure.

This at least one defected ground structure may be a defected ground structure as explained with respect to the filter module. This at least one defected ground structure may provide additional reduction of common-node noise.

According to an example embodiment of the second aspect of the present invention, the conductor module comprises layer of carbon nanotubes at least partially deposited on outer surfaces of the at least one ground layer.

For instance, the carbon nanotube (CNT) layer may be at least partially deposited on outer surfaces of the at least one ground layer. This CNT layer may represent a CNT film layer. As an example, this additional CNT layer may increase noise isolation.

For instance, the carbon nanotube layer may surround the dielectric layer and the at least one ground layer. As an example, the CNT layer may completely surround the dielectric layer and the at least one ground layer, thereby also surrounding the sides of the dielectric layer.

For instance, because interconnections are never perfectly symmetric and part of the at least one differential signal when travelling through the at least two transmission lines may not perfectly balanced, common-mode noise may be generated by means of the at least one differential signal transmitted through the at least two transmission lines. This common-mode noise may be reduced by one of the conductor modules.

As an example, the CNT layer may further reduce common-noise coupling from the differential signal to a cellular antenna, and may also reduce transmitted power from a cellular transmitter antenna to the at least two transmission lines.

According to an example embodiment of the second aspect of the present invention, the carbon nanotube layer surrounds the dielectric layer and the at least one ground layer.

For instance, the CNT may surround the dielectric layer and the at least one ground layer at least partially or completely.

According to an example embodiment of the second aspect of the present invention, the conductor module comprises one or more ground lines.

The one or more ground lines may represent strip lines as explained above with respect to the at least two transmission lines. Furthermore, the ground lines and the at least two transmission lines may represent coplanar lines.

For instance, the ground lines may also be embedded in the dielectric layer.

According to an example embodiment of the second aspect of the present invention, the conductor module represents a printed circuit structure.

For instance, the conductor module may represent a flexible printed circuit structure like a flexible printed circuit board.

According to an example embodiment of the second aspect of the present invention, the system comprises a further apparatus comprising a receiver module configured to receive the at least one differential signal, wherein the conductor module is configured to be connected with the further apparatus.

The receiver module may be configured to receive the at least one differential signal, wherein the conductor module may be configured to be connected with the further apparatus. For instance, the further apparatus may comprise a connector/interface which is configured to be connected to conductor module in order to connect with the at least two transmission lines of the connector module. Furthermore, the connector/interface is connected with the receiver module in order to transmit the received at least one differential signal to the receiver module.

According to an example embodiment of the second aspect of the present invention, said further apparatus comprises an optional filter module configured to at least partially filter out noise generated by said at least one received differential signal.

This filter module may represent any of the above mentioned filter modules. For instance, it may comprise a defected ground structure in a ground plane. Thus, common-mode noise may be filtered out in the further apparatus.

As a non-limiting example, the apparatus may represent a mobile device (for example a mobile phone) and the further apparatus may represent a mobile device sliding cover. The conductor module may represent a flexible cable and may be connected with the mobile device via an interface/connector of the mobile device and may be connected with the sliding cover via an interface/connector of the sliding cover. Due to the flexibility of cable the sliding cover can be slided, thereby moving the bendable cable.

Thus, in this example, a differential signal transmission may be performed from the mobile device to the sliding cover of the mobile device, thereby reducing common-mode noise generated by the at least one transmitted differential signal.

These and further concepts of the invention will be apparent from and elucidated with reference to the detailed description presented hereinafter.

BRIEF DESCRIPTION OF THE FIGURES

In the figures show:

FIG. 2a: a schematic illustration of a timing diagram of a differential signal according to an example embodiment of the present invention;

FIG. 2b: a schematic measurement of common-mode noise;

DETAILED DESCRIPTION

Figure 1A:
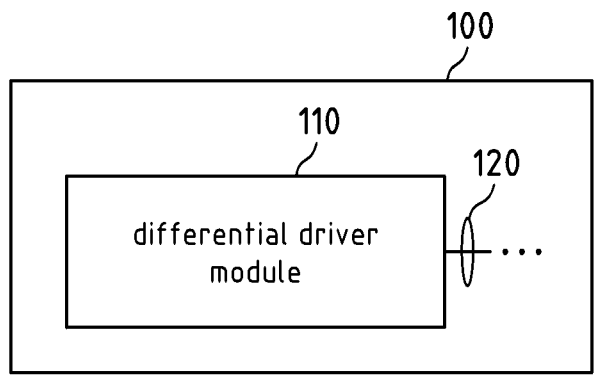
FIG. 1a: a schematic illustration of an apparatus according to a first example embodiment of the present invention.

FIG. 1a is a schematic illustration of an apparatus 100 according to a first example embodiment of the present invention. This apparatus 100 will be explained in conjunction with the schematic illustrations of timing diagram according to an example embodiment of the present invention as depicted in FIG. 2a and with the method according to an example embodiment of the present invention depicted in FIG. 1c.

The apparatus 100 comprises a differential driver module 110 which is configured to generate at least one differential signal 120 having steep rise and fall times 210 for at least partially reducing common-mode noise. In some exemplary embodiments the steep rise and fall times may be less than 35 picoseconds (ps). As a non-limiting example, this apparatus 100 may represent a part of a mobile phone, mobile device, mobile terminals, smartphones, personal digital assistants or mobile computer.

Figure 1B:
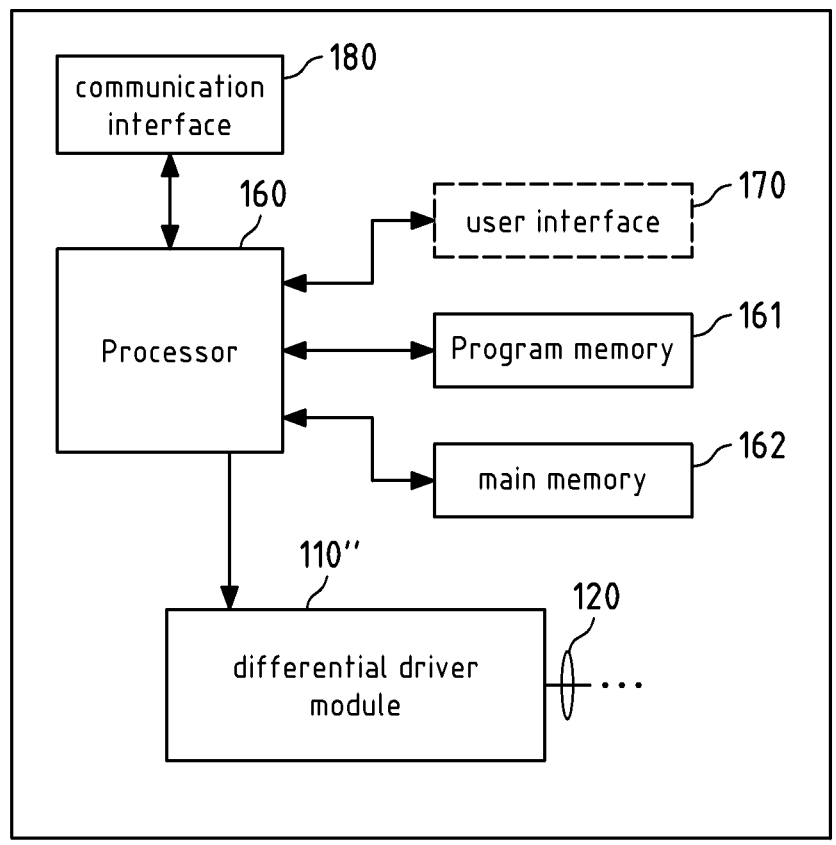
FIG. 1b: a schematic illustration of an apparatus according to a further example embodiment of the present invention.
Figure 1C:
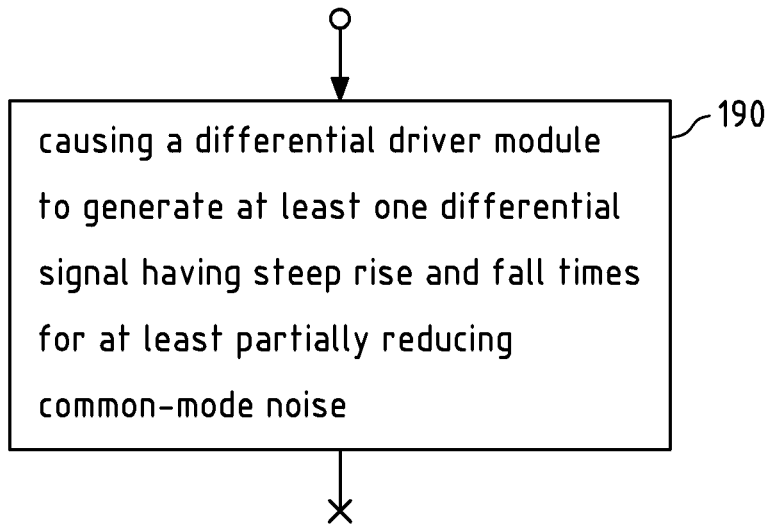
FIG. 1c: a flowchart of a method according to an example embodiment of the present invention.

Thus, it is disclosed to cause a differential driver module 110 to generate at least one differential signal having steep rise and fall times for at least partially reducing common-mode noise, as indicated by reference sign 190 in FIG. 1c.

For instance, the differential driver module 110 may be applied for a serial or parallel data transmission, wherein the at least one differential signal is used for this data transmission. Each of the at least one differential signal comprises two paired signals 221, 222 representing two substantially complementary signals 221, 222 as exemplified in FIG. 2a. For instance, each of the two paired signals of the differential signal may be configured to be transmitted via a differential signal wire pair. The differential driver module 110 may be configured to provide a substantially matching of amplitude, timing and rise and fall times for each of the two paired signals 221, 222.

Common-mode noise may be generated from timing and/or amplitude differences between two paired signals of the at least one differential signal. For instance, common-mode noise may caused by the unbalance in differential signal lines. As an example, common-mode noise may be considered as a kind of crosstalk interference resulting from similar currents flowing in the same direction in nearby wires or strips for transmitting two paired signals of the at least one differential signal.

Due to generating at least one differential signal 120 having steep rise and fall times 210, 210' common-mode noise may be effectively removed or at least partially reduced, because when rise/fall times 210 are short timing differences between two paired signals 221, 222 are reduced.

Furthermore, for instance, due to generating at least one differential signal 120 having rise/fall times 210 less than 35 ps rise/fall time matching circuits may be eliminated or are not needed at all.

Steep rise and fall times 210, 210' of a differential signal 120 of the at least differential signal may be understood to represent rise and fall times 210, 210' being short compared with a cycle time 225 of the respective differential signal.

The cycle time associated with a respective differential signal 120 may be associated with a symbol rate or binary data rate of the respective differential signal. For instance and as a non-limiting example, in case a binary data rate is 1 Gbit/s the cycle time would be 1 nanosecond (ns). Or, as another non-limiting example, in case a binary data rate is 100 Gbit/s the cycle time would be 10 picoseconds (ps).

FIG. 1b depicts a schematic illustration of an apparatus 100" according to a further example embodiment of the present invention. This apparatus 100" is based on apparatus 100 and comprises a processor 160 that executes program code stored in program memory 161. Main memory 162 is used by processor 160 for instance as working memory. Processor 160 further interacts with one or more optional communication interface 180 that may be configured to receive or transmit signals from one or more other apparatuses. Processor 160 may further interact with an optional user interface 170 that allows interaction between a user and the apparatus 100'. FIG. 1b discloses one processor but in alternative embodiments the processor may be realized by one ore more processors.

Figure 1D:
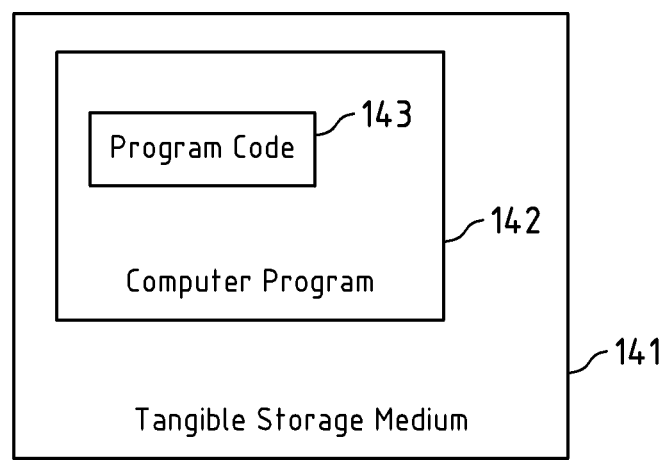
FIG. 1d: a schematic illustration of a tangible storage medium according to an embodiment of the present invention.

FIG. 1d is a schematic illustration of a tangible storage medium 141 according to an embodiment of the present invention. This tangible storage medium may for instance form at least a part of program memory 161 of the apparatus 100" of FIG. 1b. It may for instance be embodied as RAM or ROM memory, but equally well as a removable memory. Tangible storage medium 141 comprises a computer program 142, which in turn comprises program code 143. This program code 143 may for instance implement the methods of flowchart of FIG. 1c, which has been discussed and will be discussed below.

FIG. 2 depicts a schematic illustration of a timing diagram of a differential signal of the at least one differential signal 120 according to an embodiment of the present invention. This differential signal comprises two paired signals 221, 222, wherein ordinate 201 depicts the amplitude A(t) of each of these two paired signals 221, 222. $A_H$ and $A_L$ may represent the high and low amplitudes of the paired signals 221, 222. For instance, the amplitude may represent a voltage amplitude or a current amplitude.

The rise time 210 may refer to the time required for a signal 221, 222 to change from a specified low value 205 to a specified high value 206 and the fall time 210 may refer to the time required for a signal to change from the specified high value 206 to the specified low value 205. For instance, the low and high values may be 10 percent and 90 percent representatives of the step height 204 between the $A_H$ and $A_L$ or 20 percent and 80 percent representatives of the step height between the $A_H$ and $A_L$. As a non-limiting example, assuming the 20 percent and 80 percent example, the low value may be $0.2*(A_H-A_L)+A_L$ and the high value may be $0.8*(A_H-A_L)$. Any other well-suited definition of rise/fall times may also be applied.

Furthermore, as a non-limiting example for nominal values $A_H$ and $A_L$, under the non-limiting assumption of "low common mode voltage" like SLVS (scalable low voltage serial), $A_H$ may be in the range from 150 mV to 375 mV and $A_L$ may be in the range from 50 to 125 mV, wherein these values may be used in M-PHY and SATA (Serial Advanced Technology Attachment), where GND is used as lower supply voltage level and 100-ohm termination resistor is between the receiver inputs. As a non-limiting example, if separate power supply is used instead of ground as with LVDS (low voltage differential signal), or receiver end is terminated to ground or to Vdd by 50-ohm resistors instead of 100-ohms termination between inputs, values could be practically anything, both for example near Vdd equal to 5V for HDMI for example because Rx is terminated to Vdd. Any other well-suited values could be used for $A_H$ and $A_L$ which may depend on an applied interface standard.

For instance, the differential driver module 110 may represent a circuitry, for example implemented in an integrated circuit (IC). As an example, a CMOS technology may be used for this IC, but any other well-suited technology may also be used. Under the non-limiting example of CMOS, for instance, a CMOS 65 nanometer (nm) technology or a smaller technology, for example 45 nm technology or less than 45 nm, may be used for implementing the differential driver module in order to generate steep rise and fall times. Any CMOS technology enabling a differential driver module 110 to generate at least one differential signal 120 having steep rise and fall times may be applied. For instance, the rise/fall time provided by the differential driver module may be limited only by the used semiconductor technology.

As an example, the common-mode noise may be reduced at least partially in frequency bands related to wireless and/or cellular communication systems, for example 2G, 3G or 4G mobile communications systems, or related to any other radio frequency communications systems. For instance, the common-mode noise may be reduced at least partially at frequencies less than 3 GHz.

FIG. 2b depicts a schematic example measurement of noise in dBm for a frequency range spanning from 0 to 10 GHz for two different settings based on a differential signal transmission: Curve 270 depicts exemplary the measured noise generated by a 2496 Mbps differential signal transmission with relatively long rise times, i.e. much more greater than 35 ps. As can be seen from this curve 270, there is high electromagnetic interference (EMI) between 700 MHz and 2.2 GHz. Thus, cellular receiver bands in this frequency range are influenced by this noise, which mainly represents common-mode noise.

Curve 260 depicts exemplary the measured noise generated by a 2496 Mbps differential signal transmission with rise/fall times less than 35 ps. As can be seen from this curve 260, noise generated by the differential signal can be partially reduced. In particular, noise in the frequencies less than 3 GHz may be reduced at least partially. Furthermore, noise in the frequencies less than approximately 2.2 GHz may be reduced at least partially in an effective way by means of the steep rise and fall times.

For instance, a ratio between the rise time 210, 210' or the fall time 210, 210' and a cycle time 225 of the differential signal of the at least one differential signal 120 is less than:
  10 percent;
  8 percent;
  5 percent; and
  1 percent.

Thus, the ratio between the rise time 210, 210' of a respective differential signal of the at least one differential signal 120 and the cycle time 225 of this respective differential signal may be less than one of the above-stated ratios and the ratio between the fall time 210, 210' and the cycle time 225 of the respective differential signal may be less than one of the above-stated ratios. For instance, these steep rise and fall times may be less than 35 ps.

Thus, distortion of cellular receiver bands may be reduced by means of the steep rise and fall times. For instance, this may hold for any of the presented example embodiments.

Furthermore, for instance, the rise/fall times may be in one range from the following ranges:
  10 to 30 ps;
  10 to 20 ps;
  5 to 20 ps; and
  0 to 15 ps.

For instance, choosing a well-suited range may depend on an applied technology for implementing the differential driver module in an IC, and/or it may depend on generated noise in high frequency ranges. These high frequency ranges may represent frequencies greater than 3 GHz, for example greater than 5 GHz or greater than 7 GHz.

As an example, the digital data transmission may represent a data transmission with a minimum data rate greater than 300 Kbit/s, for example the digital data transmission may represent a Gbit/s data transmission. For instance, the digital data transmission may be based on the Mobile Industry Processor Interface (MIPI) Unified Protocol (UniPro) using M-PHY (serial interface technology with high bandwidth capabilities), or it may represent a USB data transmission, for example USB Version 3.0 or any other USB Version, or based on HDMI or it may represent any other Gbit/s data transmission, for example a serial digital transmission or a parallel digital transmission.

The digital data transmission may represent a data transmission with a maximum data rate less than at least one of the following data rates:
  2 Gbit/s per differential signal of the at least one differential signal;
  4 Gbit/s per differential signal of the at least one differential signal;
  6 Gbit/s per differential signal of the at least one differential signal; and
  8 Gbit/s per differential signal of the at least one differential signal.

Any explanations given with respect to the preceding embodiments may also hold for the following example embodiments.

Figure 3:
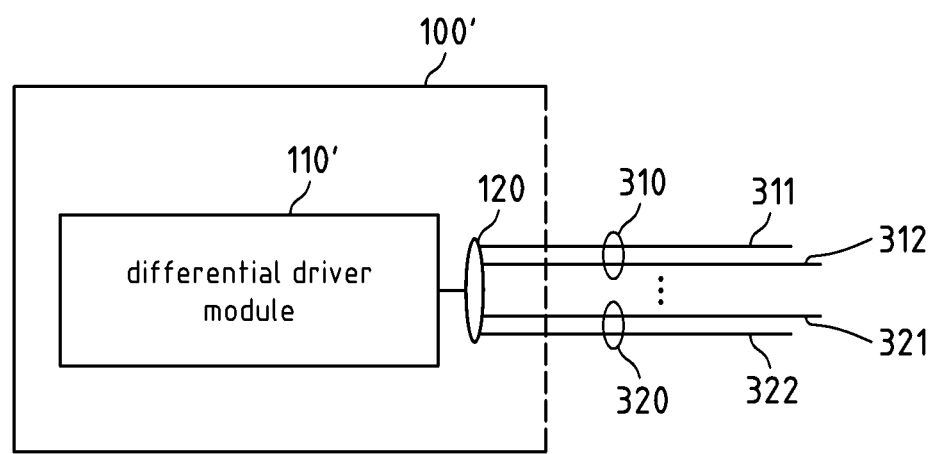
FIG. 3: a schematic illustration of an apparatus according to a second example embodiment of the present invention.

FIG. 3 depicts a schematic illustration of an apparatus 100' according to a second example embodiment of the present invention. This second example embodiment may be based on apparatus 100 according to the first example embodiment or based on apparatus 100" according to the further example embodiment.

The differential driver module 110' is configured to be connected to at least two transmission lines 311, 312, 321, 322 for transmitting the at least one differential signal 120. In this non-limiting example, the at least one differential signal 120 represents at least two differential signals 310, 320, wherein each of the differential signals 310, 320 is associated with two paired signals which are transmitted via two paired transmission lines 311, 312 or 321, 322.

As an example, these at least two transmission lines 311, 312, 321, 322 may represent wires or strip lines, for example micro strip lines. For instance, the at least two transmission lines 311, 312, 321, 322 may be configured to attenuate noise generated by fast edges of the differential signal by means of dielectric and/or skin effect losses. For instance, this noise may represent high frequency noise, for example in frequencies greater than 3 GHz.

As another example, the at least one differential signal may represent exactly one differential signal (not depicted in FIG. 3). In this example, two transmission lines 311, 312 may be used for transmitting the two paired signals representing the differential signal.

For instance, the at least two transmission lines 311, 312, 321, 322 may extend only in the apparatus 100'. As an example, this may be used for an interconnection between different modules inside the apparatus 100'. The modules might be functional units in the apparatus or externally connected to the apparatus. But, for instance, the at least two transmission lines 311, 312, 321, 322 may be located outside the apparatus 100', as indicated by dashed line 101 in FIG. 3. As an example, this may be used for connecting the apparatus 100' with another apparatus (not depicted in FIG. 3). In this example, for instance, the apparatus 100' may comprise a kind of interface configured to be connected to the at least two transmission lines 311, 312, 312, 322.

Figure 4A:
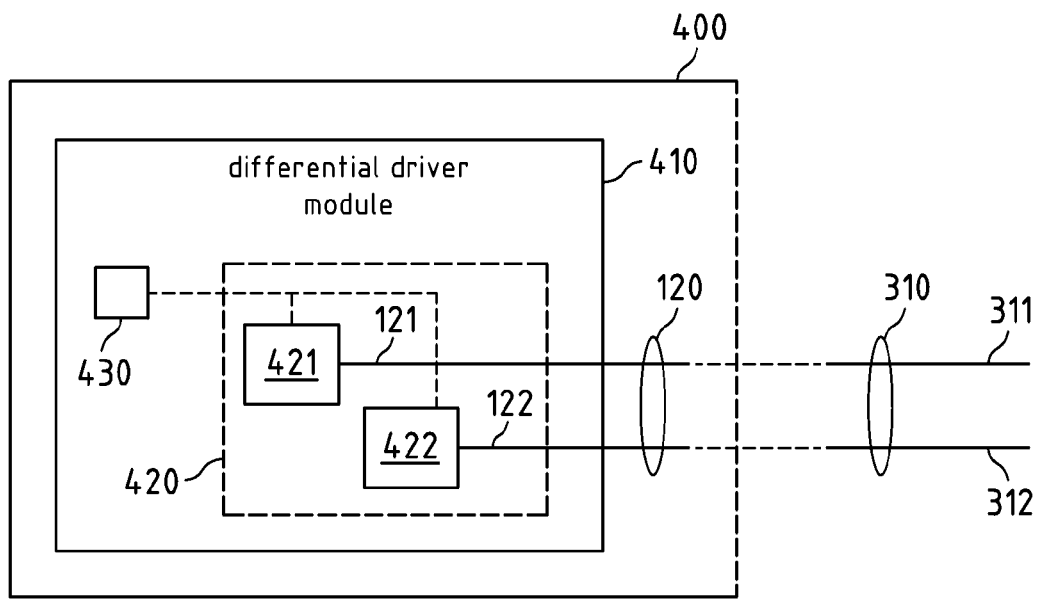
FIG. 4a: a schematic illustration of an apparatus according to a third example embodiment of the present invention.

FIG. 4a depicts a schematic illustration of an apparatus 400 according to a third example embodiment of the present invention. This third example embodiment may be based on the apparatuses 100, 100', 100'' according to the first, the second and the further example embodiment.

The differential driver module 410 comprises at least two switching modules 421, 422, wherein the two switching modules 421, 422 of the at least two switching modules 421, 422 are associated with a respective differential signal of the at least one differential signal 120. The apparatus 400 depicted in FIG. 4a is directed to the non-limiting example that the at least one differential signal 120 represents exactly one differential signal. The two switching modules 421, 422 may be considered as a pair 420 of switching modules 421, 422 associated with the respective differential signal.

One switching module 421 of the pair 420 of switching modules may be configured to output a first signal component 121 of the respective differential signal and the remaining switching module 422 of the pair 420 of switching modules may be configured to output a second signal component 122 of the respective differential signal. Thus, the first signal component 121 and the second signal component 122 represent one of the two paired signals representing a respective differential signal of the at least one differential signal.

The first signal component 121 may be transmitted via a first transmission line 311 of two paired transmission lines 311, 312 and the second signal component 122 may be transmitted via a second transmission line 312 of the same two paired transmission lines 311, 312, as depicted in FIG. 4a.

For instance, the differential driver module 410 may represent a current-mode differential driver module 410, wherein the apparatus 400 or the differential driver module 410 may comprise an optional current source 430, and wherein each of the switching modules 421, 422 is configured to connect or disconnect the current source 430 with the respective transmission line 311, 312 in response to the data to be transmitted by means of the respective differential signal.

For instance, the differential driver module 410 may represent a voltage-mode differential driver module 410, wherein the apparatus 400 or the differential driver module 410 may comprise an optional voltage source 430, and wherein each of the switching modules 421, 422 is configured to connect or disconnect the voltage source 430 with the respective transmission line 311, 312 in response to the data to be transmitted by means of the respective differential signal. As an example, the voltage source 430 may comprise a switched capacitor regulator which is configured to output a predefined voltage.

Each of the switching modules 421, 422 may comprise at least one transistor, which may be implemented in an integrated circuit.

The two switching modules 421, 422 associated with a respective differential signal may be configured to provide a substantially matching of amplitude, timing and rise/fall times for each of the two paired signals 121, 122.

For instance, the switching modules 421, 422 may be controlled by means of the processor 160 depicted in FIG. 1b.

Figure 4B:
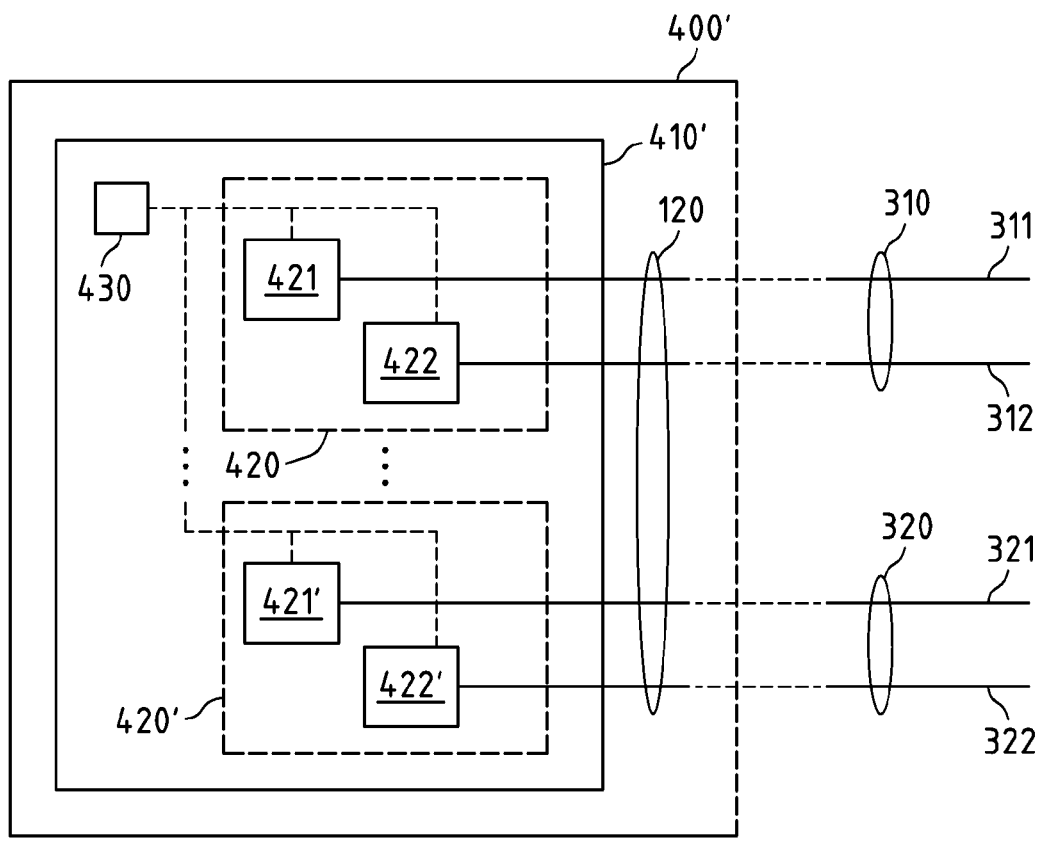
FIG. 4b: a schematic illustration of an apparatus according to a fourth example embodiment of the present invention.

FIG. 4b depicts a schematic illustration of an apparatus 400' according to a fourth example embodiment of the present invention, which is based on the apparatus 400 according to the third example embodiment of the present invention.

This apparatus 400' may present an extension of the apparatus 400 according to the third example embodiment which is configured for providing at least two differential signals.

The apparatus 400' comprises a differential driver module 410' which comprises at least two pairs 420, 420' of switching modules, wherein each of the at least two pairs 420, 420' of switching modules may be realized by the pair 420 of switching modules as explained with respect to the third example embodiment. Each of the at least two pairs 420, 420' of switching modules comprises two switching modules 421, 422, 421', 422' and is associated with a respective differential signal of the at least one differential signal, which represents at least two differential signal 310, 320 in this example.

Accordingly, a plurality of differential signals 310, 320 may be provided by means of the apparatus 400' according to this fourth example embodiment, wherein each of the differential signals 310, 320 may be transmitted through respective two paired transmission lines 311, 312, 321, 322.

Figure 4C:
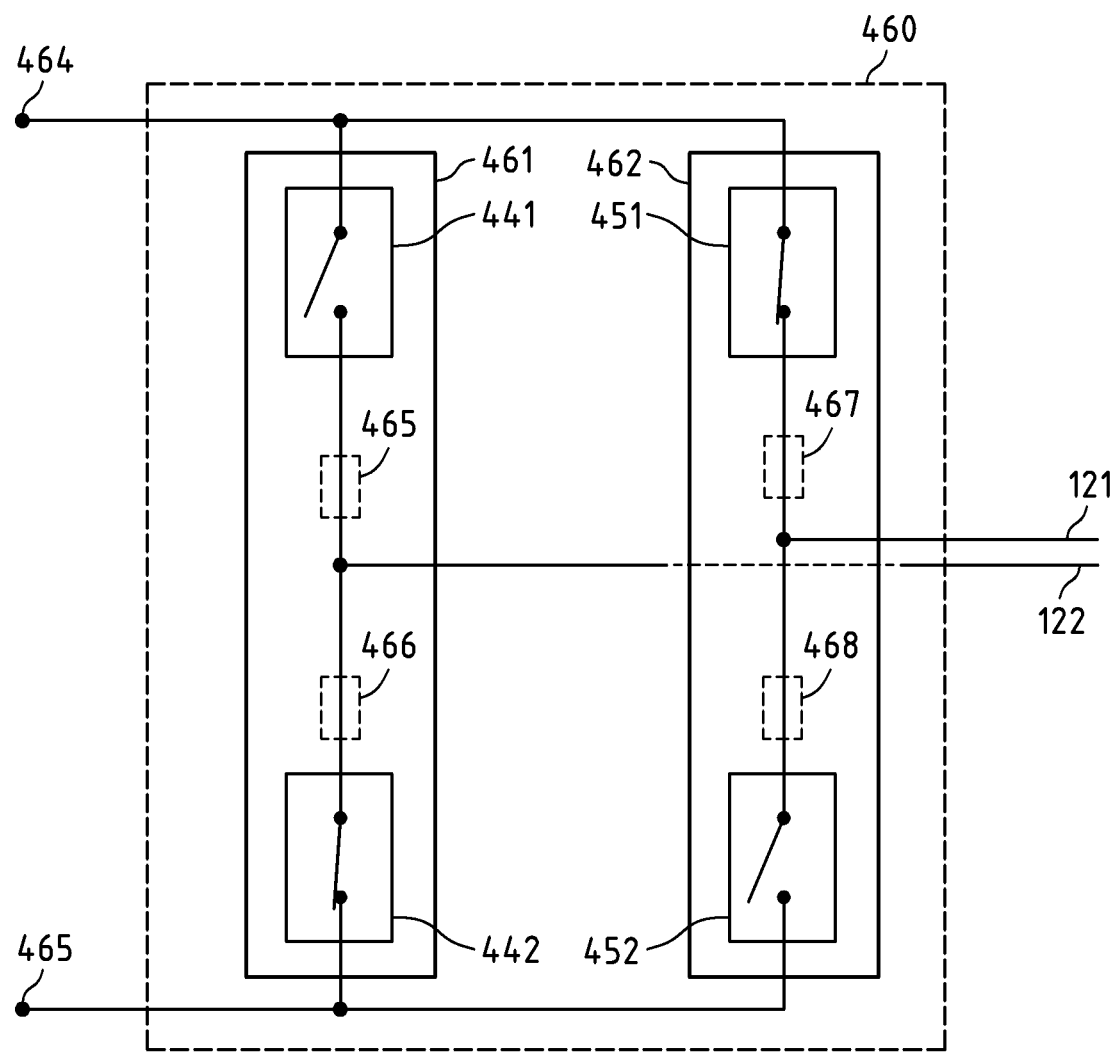
FIG. 4c: a schematic illustration of two switching modules associated with a respective differential signal according to a first example embodiment of the present invention.

FIG. 4c depicts a schematic illustration of two switching modules 461, 462 associated with a respective differential signal of the at least one differential signal 120 according to a first example embodiment of the present invention.

These two switching modules 461, 462 represent a pair 460 of switching modules associated with a respective differential signal and may be used for any of the pair 410, 410' of switching modules explained with respect to the example embodiments depicted in FIGS. 4a and 4b in conjunction with the respective differential driver module 410, 410'.

Each of the switching module 461, 462 comprises a pull-up switch 441, 451 and a pull-down switch 442, 452. For instance, each of the pull-up switches 441, 451 of a switching module 461, 462 may be configured to pull-up the respective signal component 121, 122 of the respective differential signal associated with the switching module 461, 462. Furthermore, each of the pull-down switches 442, 452 of a switching module 461, 462 may be configured to pull-down the respective signal component 121, 122 of the respective differential signal associated with the switching module 461, 462. For instance, pull-up may understood that a first voltage level, which may be provided by a voltage source and which may be applied at node 464, may be connected with the transmission line of the respective signal component 121, 122 by means of switching the respective pull-up switch 441, 451. Furthermore, for instance, pull-down may be understood that a second voltage level, which is less than the first voltage level, may be connected with the transmission line of the respective signal component 121, 122 by means of switching the respective pull-down switch 442, 452. This second voltage level may be applied at node 465. As an example, this second voltage level may represent a ground level.

For instance, the apparatus 400, 400' may comprise a controller which is configured to control the pull-up switches 441, 451 and a pull-down switches 442, 452 of a pair 460 of switching modules 461, 462 in order to switch the pull-up switches 441, 451 and pull-down switches 442, 452 in accordance with data of the respective differential signal. As an example, the processor 160 depicted in FIG. 1b may represent this controller.

Each of the pull-up switches 441, 451 and each of the pull-down switches 442, 452 may comprise a transistor, for example a CMOS transistor. For instance, the transistors may represent very low-impedance large transistors.

As an example, each of the pull-up switches 441, 451 and each of the pull-down switches 442, 452 may have an impedance in the range from approximately 40 to 60 ohm when closed. For instance, this impedance may be approximately 50 ohm. As an example, each of the pull-up switches 441, 451 and each of the pull-down switches 442, 452 may comprise an optional resistor 465, 466, 467, 468 in order to reach the impedance in above mentioned range.

For instance, each of the pull-up switches 441, 451 and each of the pull-down switches 442, 452 may comprise a transistor and an additional resistor 465, 466, 467, 468 placed in series with the respective transistor. As an example, under the non-limiting assumption of CMOS technology, the resistors 465, 466, 467, 468 may represent polysilicon resistors.

Figure 4D:
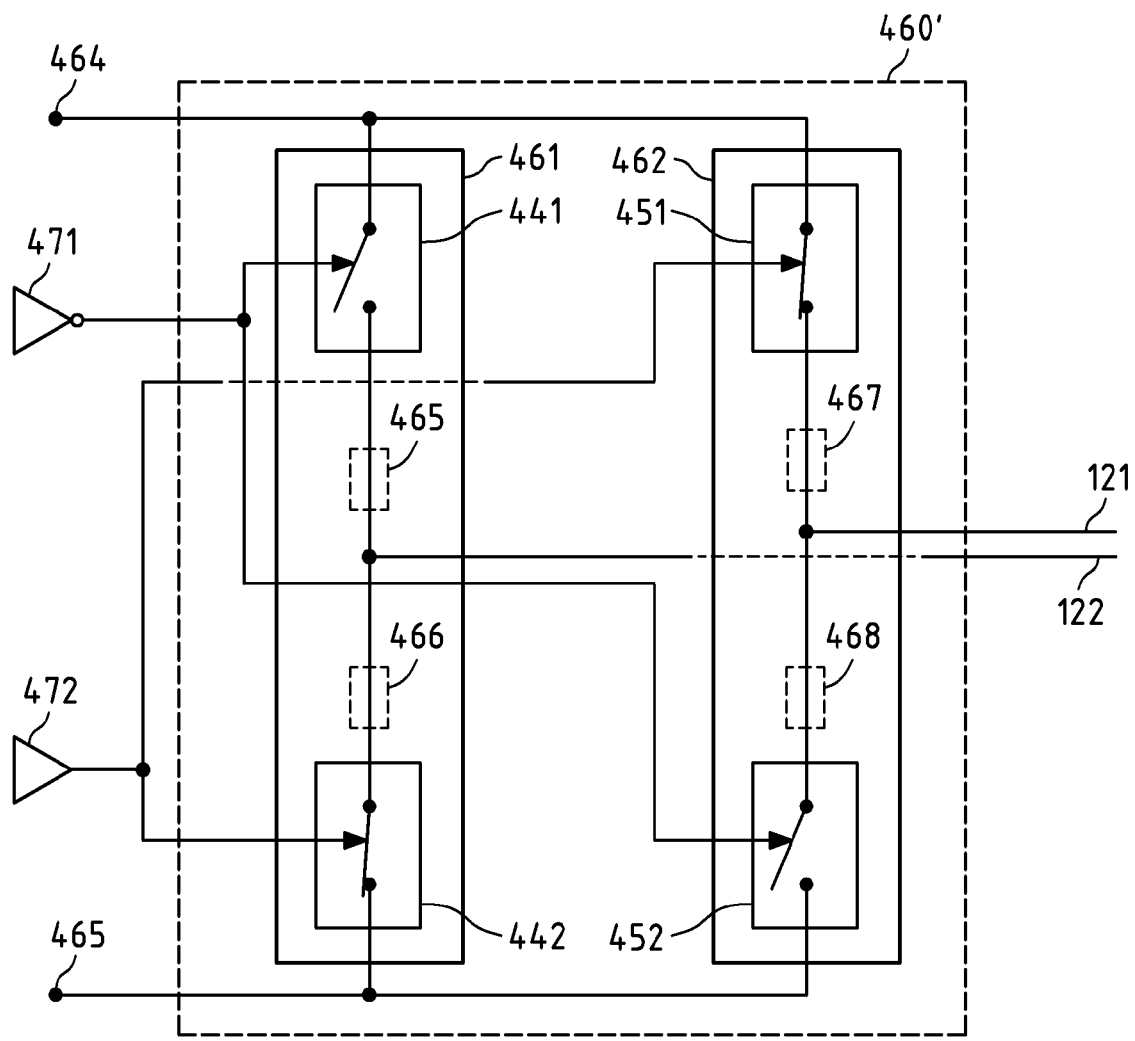
FIG. 4d: a schematic illustration of two switching modules associated with a respective differential signal according to a second example embodiment of the present invention.

FIG. 4d depicts a schematic illustration of two switching modules 461, 462 associated with a respective differential signal according to a second example embodiment of the present invention, which is based on two switching modules 461, 462 associated with a respective differential signal according to the first example embodiment of the present invention.

In addition to the first example embodiment, the pair 461' of two switching modules 461, 462 is associated with a first type pre-driver 471 and a second type pre-driver 472.

For instance, the first type pre-driver 471 may represent an inverting pre-driver 471 and the second type pre-driver 472 may represent a non-inverting pre-driver 472, as indicated in FIG. 4d. As another non-limiting example, the first type pre-driver 471 may represent a non-inverting pre-driver 471 and the second type pre-driver 472 may represent an inverting pre-driver 472.

For instance, the first type pre-driver 471 and the second type pre-driver 472 may represent pre-drivers with fast edges, for example they may represent pre-drivers with the fastest possible edges available in the respective technology.

The first type pre-driver 471 is configured to control the pull-up switch 461 of a first switching module 461 of the respective two switching modules 461, 462 and the pull-down switch 452 of a second switching module 462 of the respective two second switching modules 461, 462, and the second type pre-driver 472 is configured to control the pull-down switch 442 of the first switching module 461 of the respective two switching modules 461, 462 and the pull-up switch 452 of the second switching module 426 of the respective two second switching modules 461, 462.

Thus, for instance, the data associated with the respective differential signal associated with the two switching modules 461, 462 may control the first type pre-driver 471 and the second type pre-driver 472 in order to perform switching of the switching modules 461, 462, wherein the pull-up switch 441, 451 and the pull-down-switch 442, 452 in a switching module 461, 462 are switched in the opposite direction. For instance, this may be performed by means of processor 160 depicted in FIG. 1b.

Figure 4E:
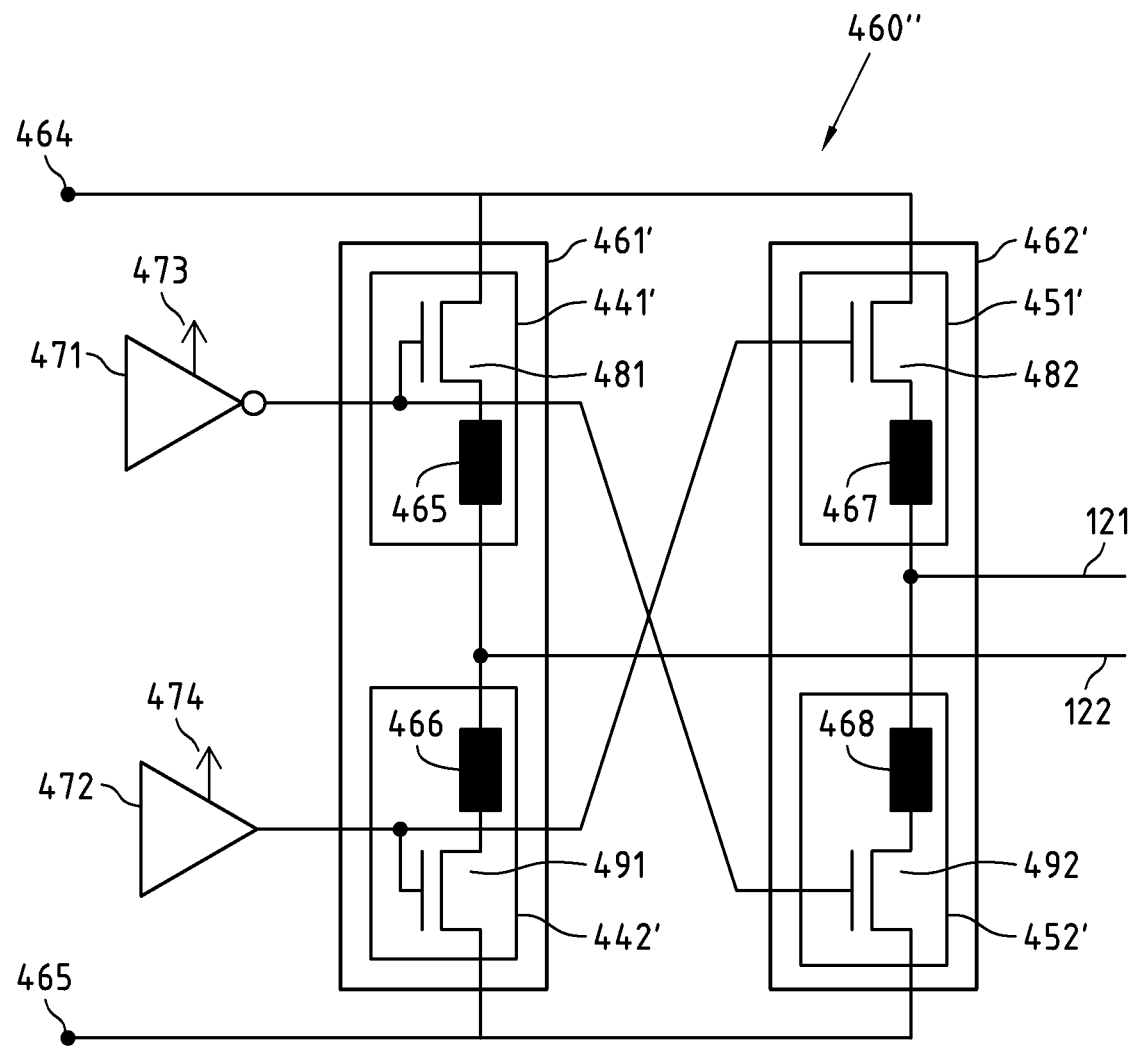
FIG. 4e: a schematic illustration of two switching modules associated with a respective differential signal according to a third example embodiment of the present invention.

FIG. 4e depicts a schematic illustration of two switching modules 461', 462' associated with a respective differential signal according to a third example embodiment of the present invention, which is based on two switching modules 461, 462 associated with a respective differential signal according to the first and second example embodiment of the present invention. The two switching modules 461' and 462' may be considered as pair 460" of switching modules.

Each of the pull-up switches 441', 451' may comprise a transistor 481, 491, which may be placed in series with the optional resistor 465, 467, and each of the pull-down switches 442', 452' may comprise a transistor 491, 492, which may be placed in series with the optional resistor 466, 468.

These transistors may represent CMOS transistors, as explained above. The first type pre-driver 471 and second type pre-driver 472 may comprise a voltage supply line 472, 474, respectively.

In a first non-limiting example of an embodiment of this pair 460" of switching modules 461', 462', the transistors 481, 482, 491, 492 may represent n-type metal-oxide semiconductor (NMOS) transistors for pull-up and pull-down, for instance as with scalable low voltage serial (SLVS) logic. For instance, the voltage at node 464 may be in the range from 200 to 500 mV, the voltage at voltage supply lines 472, 474 may be less than 500 mV, and the voltage at node 465 may be ground potential.

In a second non-limiting example of an embodiment of this pair 460" of switching modules 461', 462', the transistors 482, 492 may represent NMOS transistors for pull-down and the transistors 481, 491 may represent p-type metal-oxide semiconductor (PMOS) transistors for pull-up, for instance as with scalable low voltage serial (SLVS) logic. For instance, the voltage at node 464 may be in the range from 200 to 500 mV, the voltage at voltage supply lines 472, 474 may be less than 500 mV, and the voltage at node 465 may be ground potential.

In a third non-limiting example of an embodiment of this pair 460" of switching modules 461', 462', the transistors 481, 491 may represent NMOS transistors for pull-up and the transistors 482, 492 may represent PMOS transistors for pull-down, for instance as with ground reference low voltage differential signal (GLVDS) logic. For instance, the voltage at node 464 may be approximately 1.2 V, the voltage at voltage supply lines 472, 474 may approximately 1.2 V, and the voltage at node 465 may be ground potential.

It has to be understood that the voltage levels represent non-limiting examples and thus may differ from the presented non-limiting values.

Figure 5A:
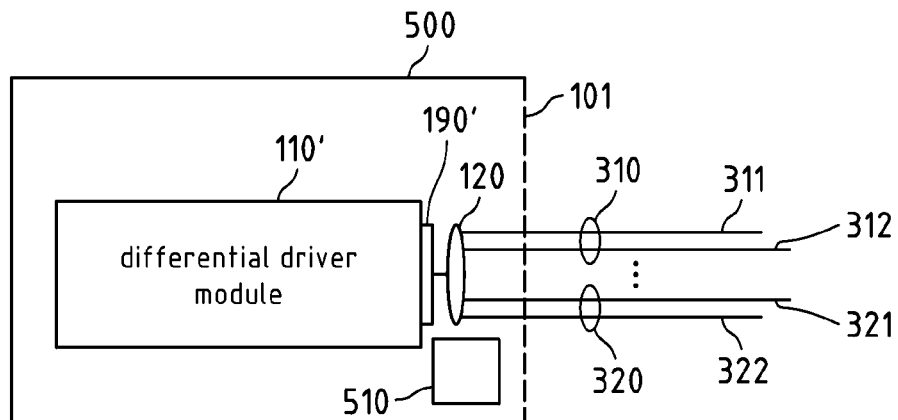
FIG. 5a: a schematic illustration of an apparatus according to a fifth example embodiment of the present invention.

FIG. 5a depicts a schematic illustration of an apparatus 500 according to a fifth example embodiment of the present invention. This apparatus 500 may be based on any one of the above explained apparatus 100, 100', 100" 400, 400' according to the first, second, further, third and fourth example embodiment. Accordingly, the explanations given with respect to these embodiments also hold for this apparatus 500 according to the fifth example embodiment.

The apparatus 500 comprises at least one filter module 510 configured to at least partially filter out noise generated by the at least one differential signal 120.

For instance, this noise may include common-mode noise due to the transmission of the at least one differential signal 120 generated by the differential driver module 110'. For instance, this noise many include noise generated by the fast edges of the differential signal having said fast rise/fall times.

As an example, at least one of said at least one filter module 510 may be configured to at least partially filter out frequencies greater than 3 GHz. Thus, noise generated by the fast edges of the differential signal may be reduced at least partially by means of this filtering.

For instance, the filter module 510 may comprise a highpass filter which may be connected to ground in order to couple high-frequency noise at least partially to ground.

Or, as another example, the filter module 510 may comprise a bandpass filter which may be connected to ground in order to couple noise in the frequency range of the bandpass filter at least partially to ground. For instance, this frequency range may represent a frequency range greater than 2.5 GHz or greater than 3 GHz. Furthermore, this frequency range may depend on a wireless transmission band. For instance, this bandpass filter may comprise a resonance filtering structure.

In FIG. 5*a*, the filter module 510 is located at an output 190' of the differential driver module 110' inside apparatus 500, wherein this output 190' is configured to output the at least one differential signal 120. Thus, noise can be reduced at the output 190 of the differential driver module 110'. For instance, the filter module 510 may extend towards the beginning of the at least two transmission lines 311, 312, 321, 322 at this output 190'.

Figure 5B:
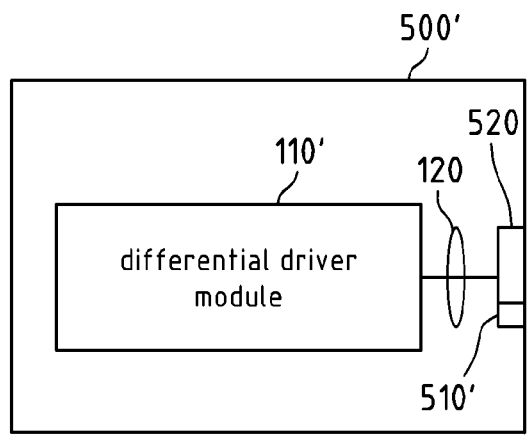
FIG. 5b: a schematic illustration of an apparatus according to a sixth example embodiment of the present invention.

FIG. 5*b* depicts a schematic illustration of an apparatus 500' according to a sixth example embodiment of the present invention. This apparatus 500' may be based on any one of the above explained apparatus 100, 100', 100", 400, 400', 500' according to the first, second, further, third, fourth and fifth example embodiment. Accordingly, the explanations given with respect to these embodiments also hold for this apparatus 500' according to the sixth example embodiment.

The apparatus 500' comprises an interface 520 or connector 520 which is connected with the differential driver module 110' in order to receive the at least one differential signal 120. Furthermore, the interface and/or connector 520 is configured to be connected with the at least two transmission lines 311, 312, 321, 322 in order to transmit the at least one differential signal 120 via these at least two transmission lines 311, 312, 321, 322.

Filter module 510', which may be based on one of the at least one filter modules explained with respect to the fifth embodiment of the apparatus, may be placed inside the connector 520 in order to at least partially filtering out noise generated by the at least one differential signal. Thus, filtering of noise may be performed before the at least one differential signal is transmitted via the at least two transmission liens 311, 312, 321, 322.

Figure 5C:
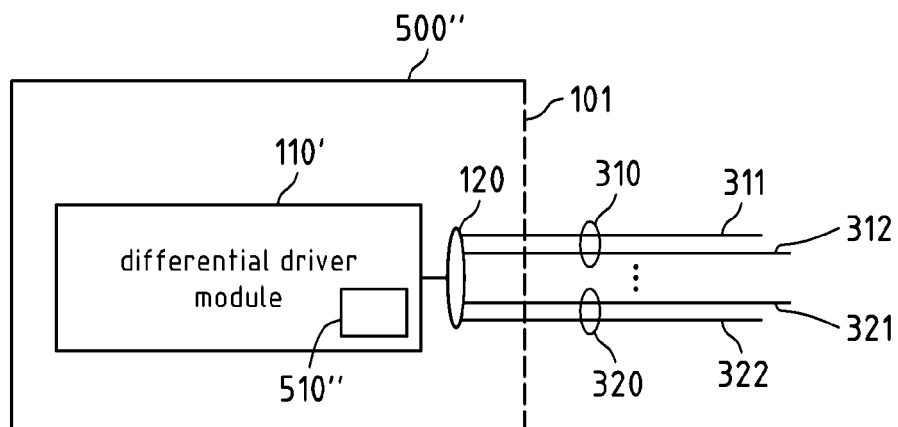
FIG. 5c: a schematic illustration of an apparatus according to a seventh example embodiment of the present invention.

FIG. 5*c* depicts a schematic illustration of an apparatus 500" according to a seventh example embodiment of the present invention. This apparatus 500" may be based on any one of the above explained apparatus 100, 100', 100", 400, 400', 500, 500' according to the first, second, further, third, fourth, fifth and sixth example embodiment. Accordingly, the explanations given with respect to these embodiments also hold for this apparatus 500" according to the seventh example embodiment.

In this apparatus 500", the differential driver module 110' comprises at least one filter module 510" of the at least one filter module configured to at least partially filtering out noise generated by the at least one differential signal 120. Filter module 510" may be based on one of the at least one filter modules explained with respect to the fifth embodiment of the apparatus.

For instance, with respect FIGS. 4*c* and 4*d*, a filter module 510" may be placed near to signal lines 121, 122 of a pair 460, 460" of switching modules 461, 462, 461', 462'.

As an example, both the differential driver module 110' and the at least one filter module 510" of the at least one filter module may be implemented in an IC.

Figure 5D:
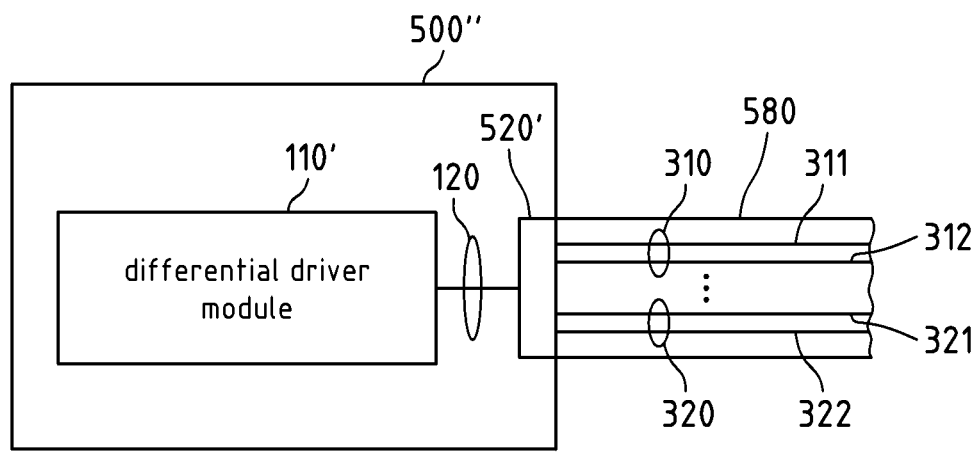
FIG. 5d: a schematic illustration of a system according to a first example embodiment of the present invention.

FIG. 5*d* depicts a schematic illustration of a system according to a first example embodiment of the present invention. This system comprises an apparatus 500''', which may be based on any one of the above explained apparatus 100, 100', 100", 400, 400', 500, 500', 500" according to the first, second, further, third, fourth, fifth, sixth and seventh example embodiment.

The differential driver module 110' is configured to be connected to the at least two transmission lines 311, 312, 321, 322. The apparatus 500''' comprises an interface and/or connector 520' in order to receive the at least one differential signal 120. Furthermore, the interface/connector 520' is configured to be connected with a conductor module 580, wherein conductor module 580 comprises the at least two transmission lines 311, 312, 321, 322. Thus, apparatus 500''' is configured to be connected to another apparatus by means of conductor module 580.

The conductor module 580 may represent any kind of cable. For instance, it may be flexible. Several examples of embodiments of this conductor module 580 will be given in the sequel.

Figure 5E:
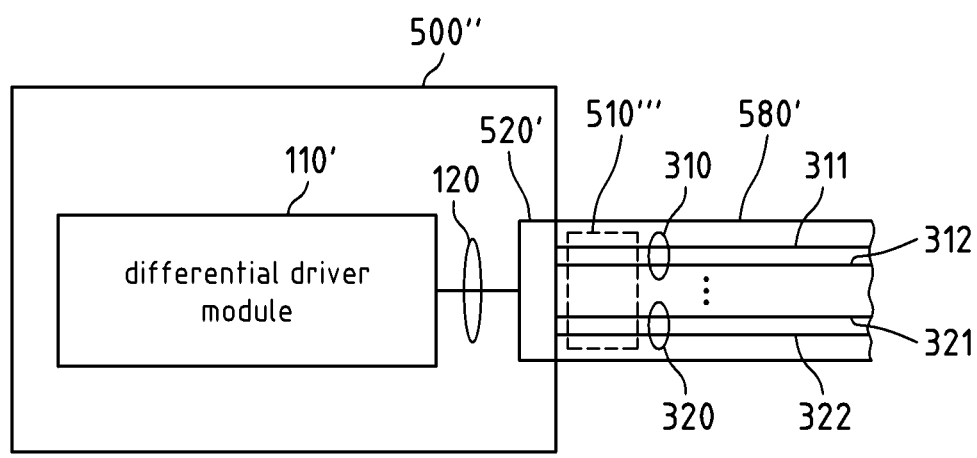
FIG. 5e: a schematic illustration of a system according to a second example embodiment of the present invention.

FIG. 5*e* depicts schematic illustration of a system according to a second example embodiment of the present invention.

This second example embodiment differs from the first example embodiment in conductor module 580', which comprises a filter module 510''' configured to at least partially filter out noise generated by the at least one differential signal 120. This filter module 510''' may be based on any one of the at least one filter modules explained above.

The filter module 510''' may be placed at one end of conductor module 580' in an area near to the interface/connector 520', when conductor module 580' connects to the interface/connector 520'. Thus, noise can be filtered out when the differential signal to be transmitted enters the conductor module 580'.

For instance, filter module 510''' may be placed under and/or above the at least two transmission lines 311, 312, 321, 322.

Figure 6A:
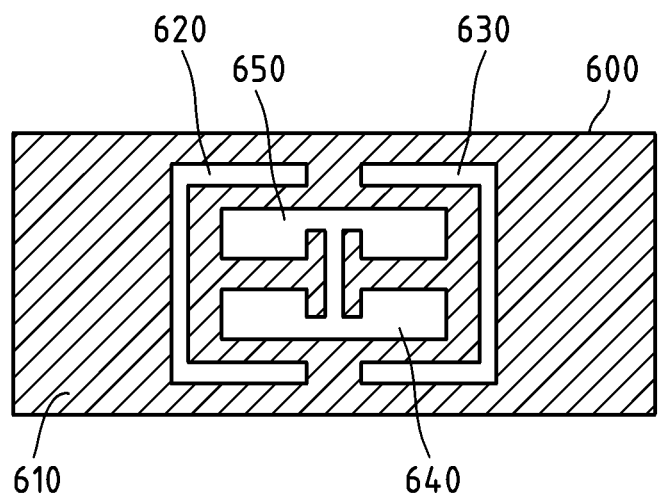
FIG. 6a: a schematic illustration of a filter module according to an example embodiment.

FIG. 6*a* depicts a schematic illustration of a filter module 600 according to an example embodiment. For instance, this filter module 600 may be used for each filter module 510, 510', 510", 510''' mentioned above.

The filter module 600 represents a defected ground structure filter. The ground structure 610 may represent a ground layer 610 or ground film 610 or ground plane 610 comprising defects 620, 630, 640. The ground structure 610 may be connected to a ground potential. The defects 620, 630, 640, 650 in the ground structure 610 are arranged to enable the desired filter characteristic, wherein each of the above mentioned filter characteristics may be applied.

As a non-limiting example, the ground structure 610 with defects 620, 630, 640, 650 may form a resonance circuit that is configured to at least partially prevent high-frequency noise generated by the at least one differential signal 120 pass into the at least two transmission lines 311, 312, 321, 322.

For instance, the ground structure 610 may be conductive, for example the material may be copper or silver or any other conductive material.

Furthermore, for instance, the conductive material may represent a frequency-dependent conductive material providing increased conductivity at increased frequencies. Thus, higher frequencies can be filtered out in a better way than lower frequencies by means of this frequency-dependent conductive material.

As a non-limiting example the ground structure 610 may represent a high-permittivity and high-permeable material. For instance, the product of relative permeability and permittivity of the material may be at least 5000 at the frequencies to be filtered, for example this product may be at least 10000 at the frequencies to be filtered.

For instance, the material of ground structure 610 may be a carbon nanotube (CNT) structure/film, for example a CoFeAlO film or any other CTN film, or any other structure or film having high electromagnetic losses. CNT is a mixture of dense and entangled nanotube networks and epoxy, polymethyl methacrylate (PMMA) or other similar material. Thickness of film may be 10 um to give up to 70 dB shielding effectiveness. Accurate shielding effectiveness may depend on concentration and conductivity of CNTs. CoFeAlO is a material having high permeability up to GHz frequencies. Thus, noise in higher frequency ranges may be attenuated effectively by means of these materials. Using CNT, for instance, may reduce the size the ground structure 610 by applying the property that electrons may travel at 1/300 speed of light in CNTs.

Figure 6B:
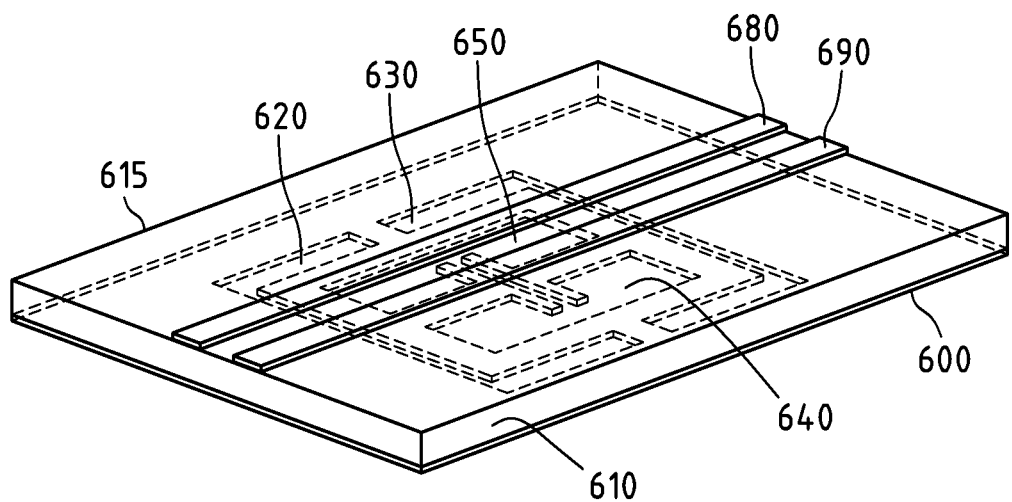
FIG. 6b: a schematic illustration of the filter module according to the example embodiment in a different view.

FIG. 6b depicts a schematic illustration of the filter module 610 according to the first example embodiment in a different view in conjunction with two lines 680, 690 for transmitting the at least one differential signal.

In this example view, the lines 680, 690 may represent strip lines or any other kind of wires. For instance, the lines 680, 690 may represent two lines of the at least two transmission lines 311, 312, 321, 322, or the lines 680, 690 may represent internal lines for transmitting the signals 121, 122 as exemplarily depicted in FIGS. 4c to 4e.

The filter module 610 is disposed near to the two lines 680, 690 in order filter out noise as described above, for example it may be placed above or under the two lines 680, 690.

For instance, with respect to example depicted in FIG. 5e, filter module 510''' may represent filter module 610, wherein the two lines 680, 690 may represent two transmission lines of the at least two transmission lines 311, 312, 321, 322. For instance, conductor module 580' may comprise more than one filter module 510', wherein each of the filter modules 510' is placed under and/or above a pair 310, 320 of two transmission lines.

Figure 7A:
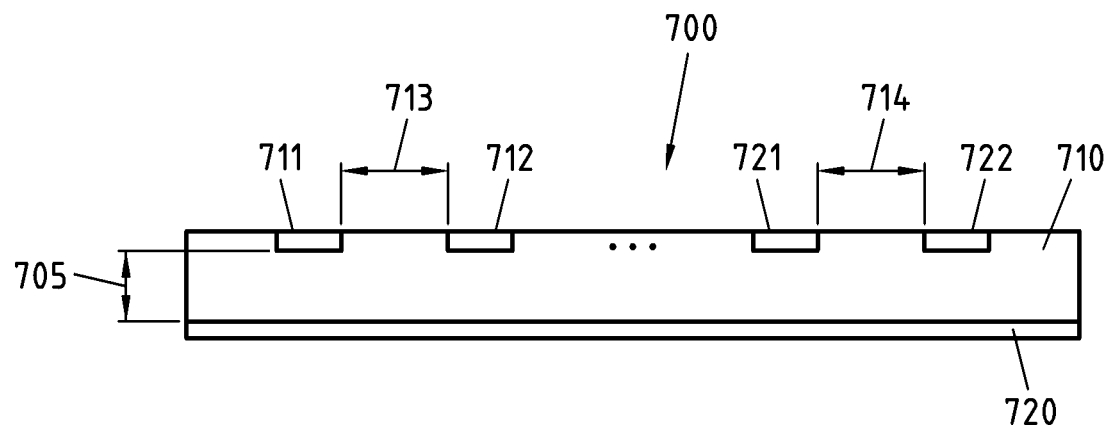
FIG. 7a: a schematic illustration of a cross-sectional view of a conductor module according to a first example embodiment.

FIG. 7a depicts a schematic illustration of a cross-sectional view of a conductor module 700 according to a first example embodiment. For instance, this conductor module 700 may be based or may represent conductor module 580 or conductor module 580'.

This conductor module 700 comprises at least two transmission lines 711, 712, 721, 722 configured to be used for transmission of the at least one differential signal. Although four transmission lines 711, 712, 721, 722 are depicted in FIG. 7a, it has to be understood that exactly two transmission lines may be used or more than four transmission lines may be used. For example, for each of the at least one differential signal two transmission lines 711, 712, 721, 722 may be used, wherein two transmission lines 711, 712 (721, 722) associated with the same differential signal of the at least one differential signal 120 may represent a signal pair.

For instance, the at least two transmission lines 711, 712, 721, 722 may represent the at least two transmission lines 311, 312, 321, 322 mentioned above.

The conductor module 700 comprises a dielectric layer 710. This dielectric layer 710 may provide >1 relative permittivity. For instance, the dielectric layer may provide high permittivity.

Furthermore, the dielectric layer 710 material may be flexible. This may enable the conductor module 700 to be bendable. For instance, the conductor module 700 may represent a printed circuit board. As an example, the conductor module 700 may represent a flexible printed circuit cable. Furthermore, the dielectric layer 710 may at least partially represent foam dielectric, for example Teflon® foam by Gore, but any other well-suited foam dielectric may also be used. This may increase bendability.

The at least two transmission lines 711, 712, 721, 722 may represent strip lines. For instance, said strip lines may comprise one of the following materials: copper, aluminium, and carbon nanotube. The stripe lines may comprise any other well-suited material providing sufficient conductivity.

The conductor module 700 may comprise an optional ground layer 720 deposited below the dielectric layer 710. As a non-limiting example, the ground plane may be composed of silver paste painting, copper paste painting, copper-silver hybrid paste panting, or by another conductive painting.

For instance, two transmission lines 711, 712 or 721, 722 associated with the same differential signal may be arranged in a tight distance 713 or 714 so that these two transmission lines 711, 712 or 721, 722 are relatively tightly coupled so that differential signalling fields does not extend considerably into the ground layer 720. This coupling may represent the electromagnetic coupling between two transmission lines 711, 712 or 721, 722 associated with the same differential signal. Furthermore, in case conductor module 700 comprises at least one optional ground line (not depicted in FIG. 7a), for example like ground lines 731, 732 and 733 depicted in FIG. 7b, differential signal's electromagnetic fields may be kept near the at least two transmission lines 711, 712 or 721, 722 and the optional ground lines 731, 732, 733. For instance, two transmission lines 711, 712 or 721, 722 associated with the same differential signal may represent coplanar transmission lines.

Furthermore, the ground layer 720 may be so close 705 to the at least two transmission lines 711, 712, 721, 722 that a common-mode component of the at least one differential signal may use the ground layer 720 as return current path. Thus, common-mode components of the at least one differential signal may be attenuated by means of the ground layer 720 acting a return current path. For instance, the ground layer 720 may not be used as return current path for differential signalling. The resistivity of the ground layer 720 may be relatively large.

As an example, the ground layer 720 may comprise at least one defected ground structure, for example as explained with respect to the filter module 600 depicted in FIG. 6a. This at least one defected ground structure may provide additional reduction of common-node noise.

For instance, as a non-limiting example, in case the at least two transmission lines 711, 712, 721, 722 represent strip lines, the strip lines may have a width of approximately 60 micrometer (um) and a height of approximately 18 um, and the distance 705 between a transmission line and the ground plane 720 may be approximately 40 um. These exemplary dimensions may vary, even in order of magnitudes.

Figure 7B:
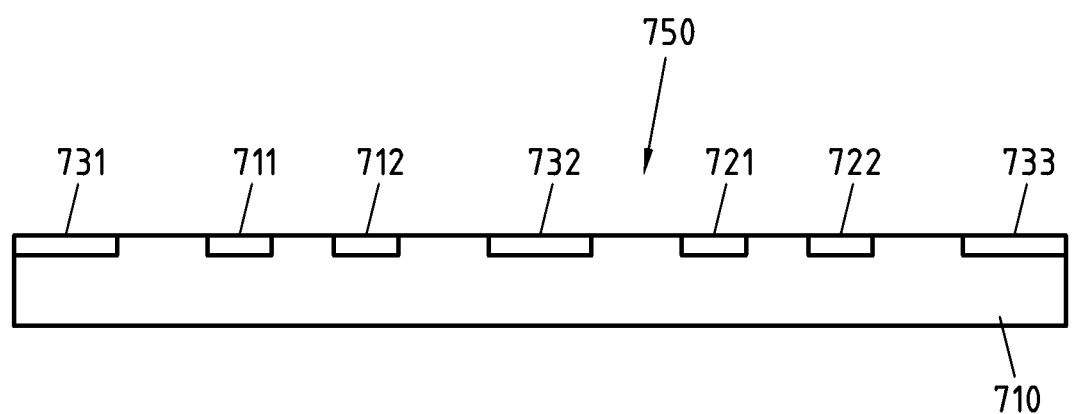
FIG. 7b: a schematic illustration of a cross-sectional view of a conductor module according to a second example embodiment.

FIG. 7b depicts a schematic illustration of a cross-sectional view of a conductor module 750 according to a second example embodiment. The explanations presented with respect to first example embodiment of conductor module 700 depicted in FIG. 7a also hold for this second embodiment, except for the ground plane 720.

The conductor module 750 comprises at least one ground line 731, 732, 732, which may be formed as strip lines (as depicted in FIG. 7b). Said strip lines may comprise one of the following materials: copper, aluminium, and carbon nanotube. The stripe lines may comprise any other well-suited material providing sufficient conductivity.

The at least two transmission lines 711, 712, 721, 722 and the at least one ground line may be arranges as coplanar lines. For instance, two transmission lines 711, 712 or 721, 722 associated with the same differential signal may be arranged in a tight distance 713 or 714 so that these two transmission lines 711, 712 or 721, 722 are relatively tightly coupled so that differential signalling fields does not extend considerably into the ground layer 720, and, further, a ground line 731 or 732 may be arranged on the left hand side of the two transmission lines 711, 712 or 721, 722 and a ground line 732 or 733 may be arranged on the right hand side of the two transmission lines 711, 712 or 721, 722. Thus, for instance, the differential signal's electromagnetic fields may be kept near the at least two transmission lines 711, 712, 721, 722 and the ground lines 731, 732, 733.

Figure 7C:
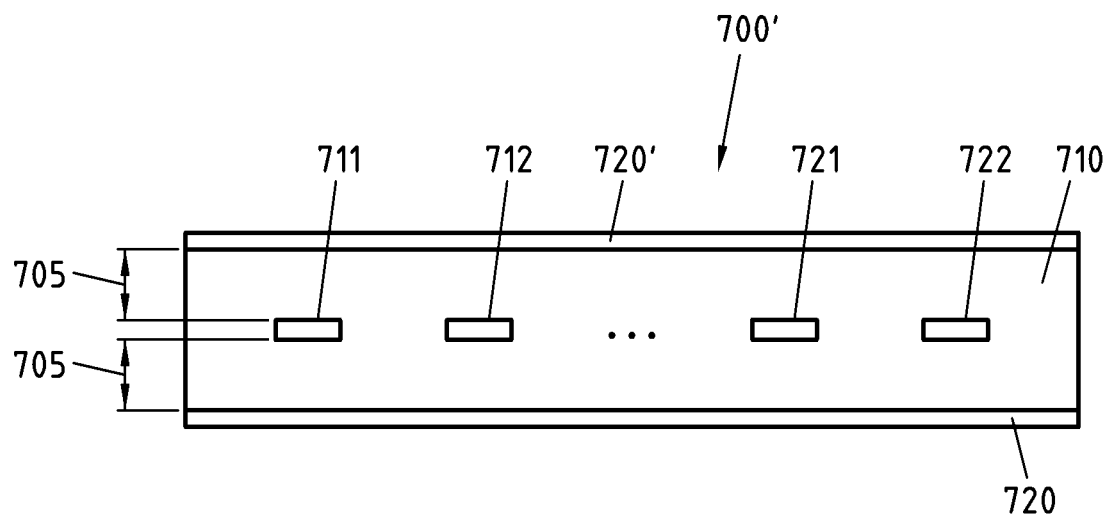
FIG. 7c: a schematic illustration of a cross-sectional view of a conductor module according to a third example embodiment.

FIG. 7c depicts a schematic illustration of a cross-sectional view of a conductor module 700' according to a third example embodiment, which is substantially based on conductor module 700 according to the first example embodiment. Thus, explanations presented with respect to first example embodiment of conductor module 700 depicted in FIG. 7a also hold for this third embodiment.

The at least two transmission lines 711, 712, 721, 722 are completely embedded in dielectric layer 710. Furthermore, a second ground layer 720' is deposited on the upper surface of dielectric layer 710. The explanations presented with respect to ground layer 720 also hold for this second ground layer 720'. Thus, an improved shielding of the at least two transmission lines 711, 712, 721, 722 may be achieved due to the use of two ground planes 720, 720'.

Figure 7D:
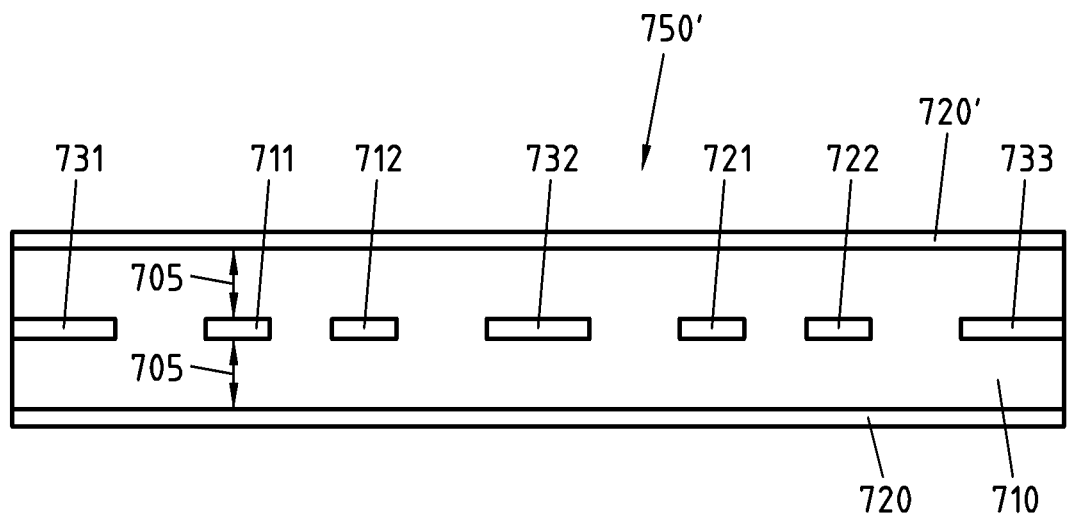
FIG. 7d: a schematic illustration of a cross-sectional view of a conductor module according to a fourth example embodiment.

FIG. 7d depicts a schematic illustration of a cross-sectional view of a conductor module 750' according to a fourth example embodiment, which is substantially based on conductor module 750 according to the second example. Thus, explanations presented with respect to second example embodiment of conductor module 750 depicted in FIG. 7b also hold for this fourth embodiment.

The conductor module 750' comprises a first ground layer 720 deposited at the lower surface of dielectric layer 710 and a second ground layer 720' deposited on the upper surface of dielectric layer 710. Both the first ground layer 720 and the second ground layer 720' may represent one of the ground layers 720, 720' presented above. Thus, an improved shielding of the at least two transmission lines 711, 712, 721, 722 may be achieved due to the use of two ground planes 720, 720'.

Figure 7E:
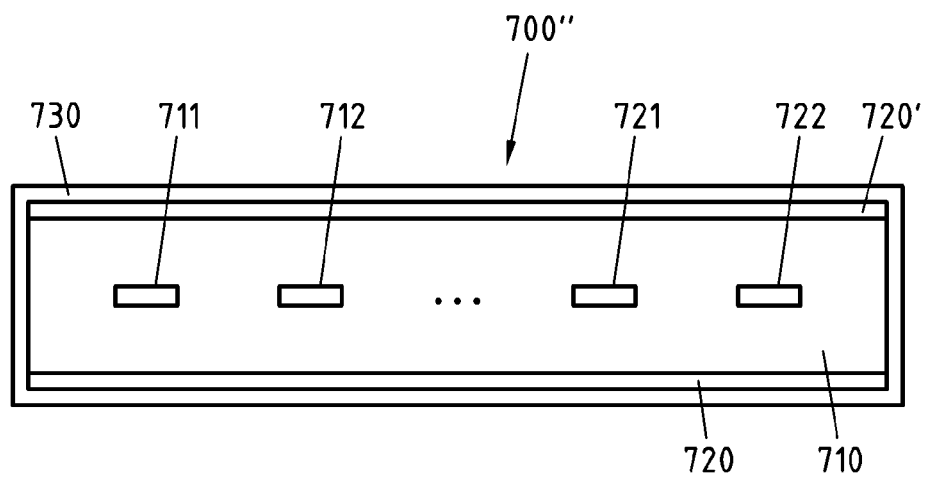
FIG. 7e: a schematic illustration of a cross-sectional view of a conductor module according to a fifth example embodiment.

FIG. 7e depicts a schematic illustration of a cross-sectional view of a conductor module 700" according to a fifth example embodiment, which is substantially based on conductor modules 700, 700' according to the first and third example embodiment as presented by FIGS. 7a and 7c. Thus, explanations presented with respect to first and third example embodiment of conductor modules 700, 700' also hold for this fifth embodiment.

Figure 7F:
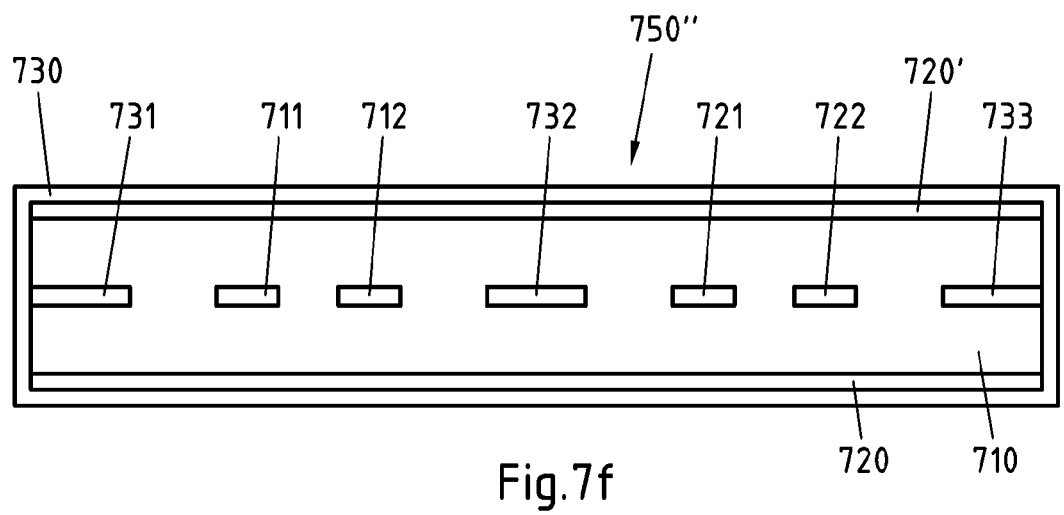
FIG. 7f: a schematic illustration of a cross-sectional view of a conductor module according to a sixth example embodiment.

FIG. 7f depicts a schematic illustration of a cross-sectional view of a conductor module 750" according to a sixth example embodiment, which is substantially based on conductor modules 750, 750' according to the second and fourth example embodiment as presented by FIGS. 7b and 7d. Thus, explanations presented with respect to second and fourth example embodiment of conductor modules 750, 750' also hold for this fifth embodiment.

Both the conductor module 700" and conductor module 750" comprises a carbon nanotube (CNT) layer 730 which is at least partially deposited on outer surfaces of the first and second ground layer 720, 720'. This CNT layer 730 may represent a CNT film layer. This additional CNT layer may increase noise isolation.

For instance, the carbon nanotube layer may surround the dielectric layer 710 and the first and second ground layer 720, 720, as depicted in FIGS. 7e and 7f. As an example, the CNT layer may completely surround the dielectric layer 710 and the ground layer 720, 720', thereby also surrounding the sides of the dielectric layer 710.

For instance, because interconnections are never perfectly symmetric and part of the at least one differential signal when travelling through the at least two transmission lines 711, 712, 721, 722 may not perfectly balanced, common-mode noise may be generated by means of the at least one differential signal transmitted through the at least two transmission lines 711, 712, 721, 722. This common-mode noise may be reduced by one of the conductor modules 700, 700', 700', 750, 750', 750".

As an example, the CNT layer 730 according to these fifth and sixth embodiment may further reduce common-noise coupling from the differential signal to a cellular antenna, and may also reduce transmitted power from a cellular transmitter antenna to the at least two transmission lines 711, 712, 721, 722.

For instance, as a non-limiting example, the CNT layer 730 may have a width of approximately 60 micrometer (um) and a height of approximately 18 um, and the distance 705 between a transmission line and the ground plane 720 may be approximately 40 um. For instance, the complete height of conductor module 700" or conductor module 750" may be approximately 100 um. These exemplary dimensions may vary, even in order of magnitudes.

Figure 7G:
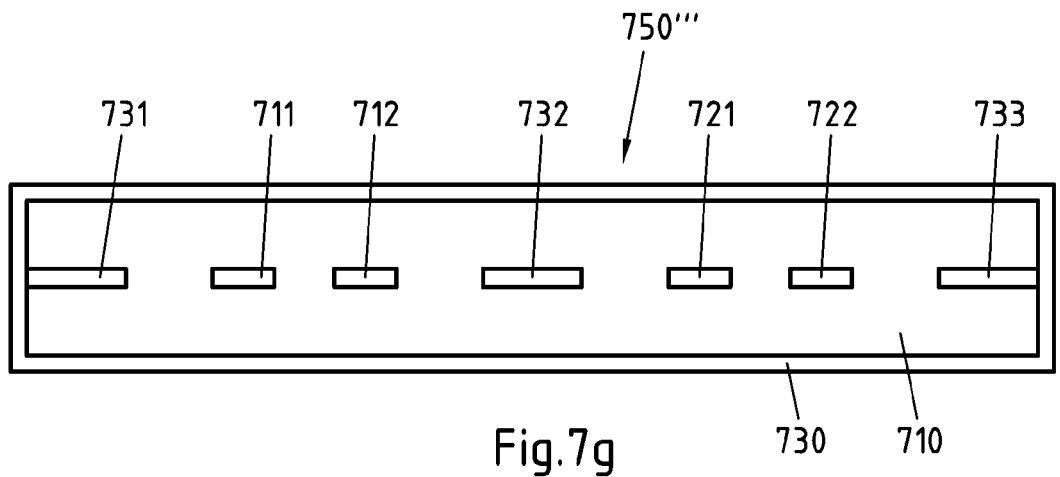
FIG. 7g: a schematic illustration of a cross-sectional view of a conductor module according to a seventh example embodiment.

FIG. 7g depicts a schematic illustration of a cross-sectional view of a conductor module 750''' according to a seventh example embodiment, which is substantially based on conductor modules 750, 750', 750" according to the second, fourth and sixth example embodiment as presented by FIGS. 7b, 7d and 7f. Thus, explanations presented with respect to second, fourth and sixth example embodiment of conductor modules 750, 750', 750" may also hold for this sixth embodiment.

Conductor module 750''' differs from the conductor module 750" depicted in FIG. 7f that conductor module 750''' comprises no ground layer 720, 720". Thus, the CNT layer 730 according to the seventh embodiment is directly placed on the outside of dielectric layer 710.

Figure 8A:
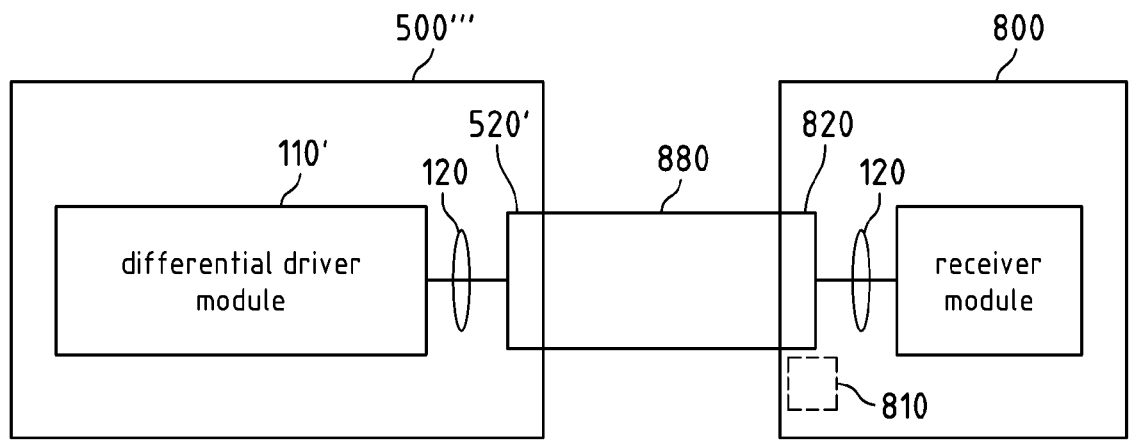
FIG. 8a: a schematic illustration of a system according to a third example embodiment of the present invention.

FIG. 8a depicts a schematic illustration of a system according to a third example embodiment of the present invention. This system comprises an apparatus 500''' as explained above.

The conductor module 880 may represent or be based on any of the conductor modules 580, 580' explained above.

The system comprises a further apparatus 800 which comprises a receiver module 830. The receiver module 830 is configured to receive the at least one differential signal 120, wherein the conductor module 880 is configured to be connected with the further apparatus 800. For instance, the further apparatus 800 may comprise a connector and/or interface 820 which is configured to be connected to conductor module 880 in order to connect with the at least two transmission lines of the connector module 880. Furthermore, the connector/interface 820 is connected with the receiver module in order to transmit the received at least one differential signal 120' to the receiver module.

Said further apparatus 800 may comprise an optional filter module 810 configured to at least partially filter out noise generated by said at least one received differential signal 120'. This filter module 810 may represent any of the above mentioned filter modules 510, 510', 510", 600. For instance, it may comprise a defected ground structure. Thus, common-mode noise may be filtered out in the further apparatus 800.

Figure 8B:
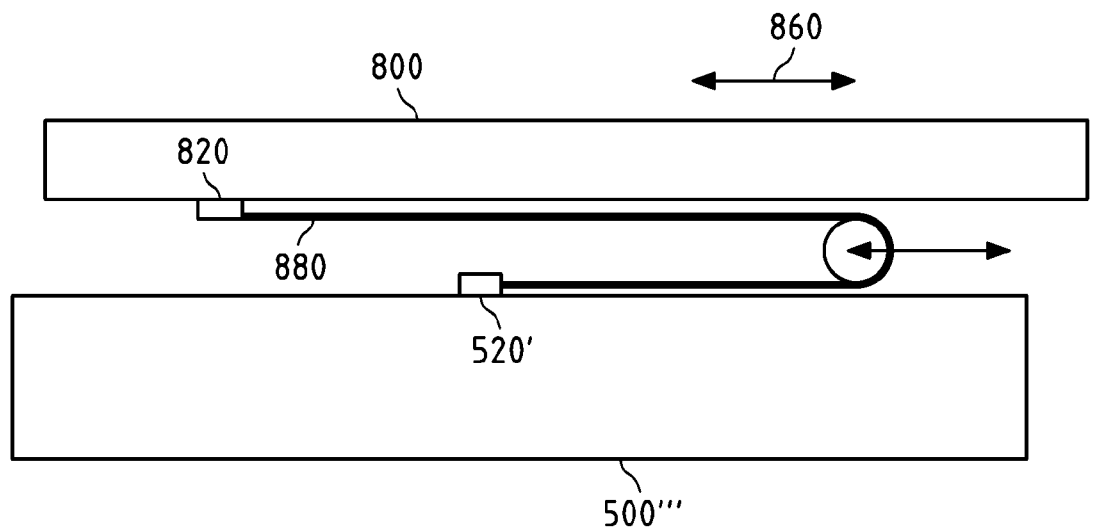
FIG. 8b: a schematic illustration of a system according to a fourth example embodiment of the present invention.

FIG. 8b depicts a schematic illustration of a system according to a fourth example embodiment of the present invention. This fourth example embodiment is based on the system according to the third example embodiment.

In this example, apparatus 500''' represents a mobile terminal 500''' and the further apparatus 800 represent a mobile terminal sliding cover 800. The conductor module 880 represents a flexible cable 880 and is connected with the mobile terminal via interface/connector 520' and is connected with the sliding cover 800 via interface/connector 820'. Due to the flexibility of cable 880 the sliding cover 800 can be slid, as indicated by reference sign 860, thereby moving the bendable cable 880.

Figure 9:
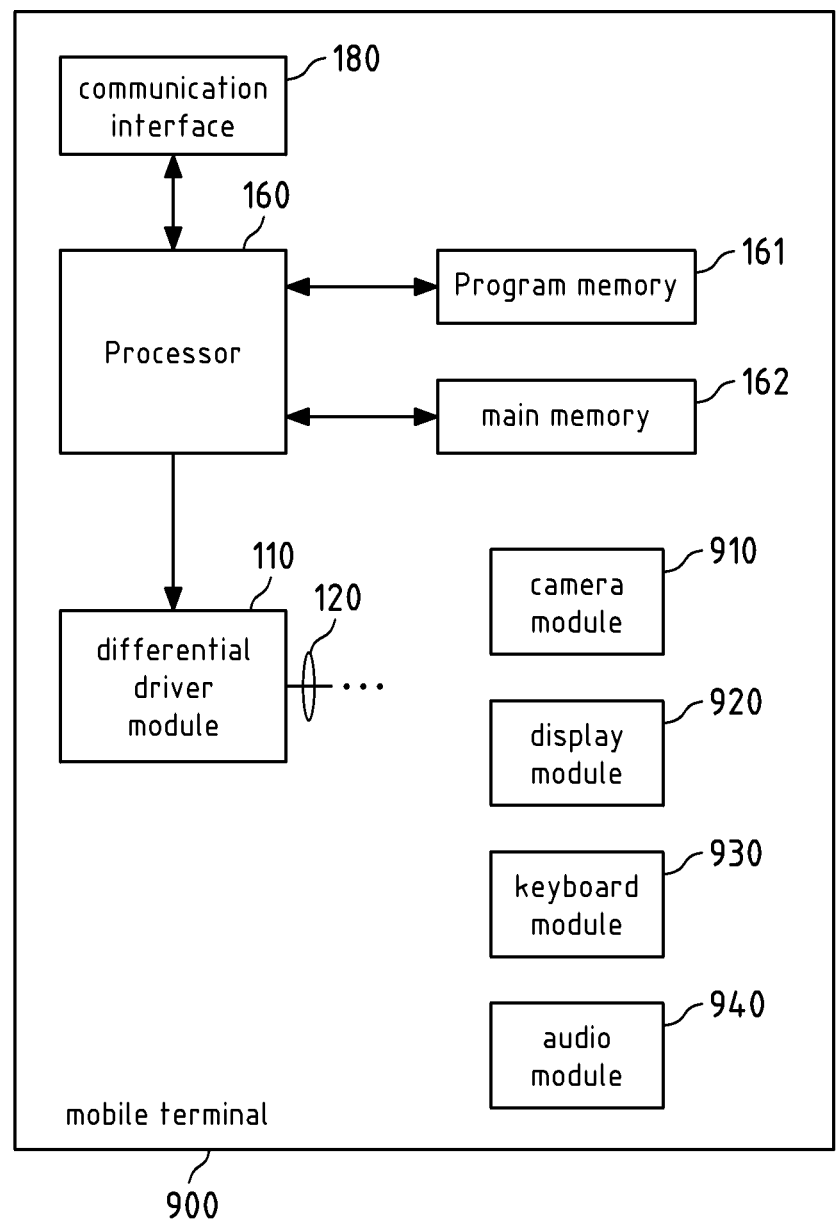
FIG. 9: a schematic illustration of a mobile terminal according to an example embodiment of the present invention.

FIG. 9 depicts a schematic illustration of a mobile terminal 900 according to an example embodiment of the present invention.

This mobile terminal 900 may be based on the apparatus 100" according to the further example embodiment depicted in FIG. 1b. Thus explanations presented with respect to apparatus 100" depicted in FIG. 1b may also hold for this mobile terminal 900.

The mobile terminal 900 comprises at least one differential driver module 110 (only one module 110 is depicted in FIG. 9). Furthermore, the mobile terminal 900 may comprise at least one module of a camera module 910, a display module 920, a keyboard module 930, an audio module 940 and a further functional module. Each of the at least one module may be configured to communicate based on the at least one differential signal having steep rise and fall times. For instance, at least one of the at least one module may comprise a differential driver module, which may be implemented based on one of the presented driver modules. Thus, this at least one of the at least one module may be configured generate at least one differential signal. For instance, the camera module 910 may generate such a differential signal for transmitting a captured picture to the processor 160. Thus, for instance, the differential data transmission having steep rise and fall times may be used for data transmission between the processor 160 of the mobile terminal and functional modules 910, 920, 930, 940 of the mobile terminal and/or between the processor and interfaces, as described with respect to the embodiments 8a and 8b.

Furthermore, for instance, at least one of the modules 910, 920, 930, 930 may be located outside a main housing of the mobile terminal. For instance, the display module 920 may be located inside the sliding cover 800 depicted in FIGS. 8a and 8b, wherein the mobile terminal 900 is configured to be connected to this display module 920 via one of the at least one differential driver module 110' as explained with respect to the embodiments depicted in FIGS. 8a and 8b.

As an example, the mobile terminal 900 may at least partially represent mobile terminal 500''' depicted in FIG. 8b.

As used in this application, the term 'circuitry' refers to all of the following:
(a) hardware-only circuit implementations (such as implementations in only analog and/or digital circuitry) and (b) combinations of circuits and software (and/or firmware), such as (as applicable):
  (i) to a combination of processor(s) or
  (ii) to portions of processor(s)/software (including digital signal processor(s)), software, and memory(ies) that work together to cause an apparatus, such as a mobile terminal or a positioning device, to perform various functions) and
(c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile terminal or a positioning device.

The invention has been described above by means of embodiments, which shall be understood to be non-limiting examples. In particular, it should be noted that there are alternative ways and variations which are obvious to a skilled person in the art and can be implemented without deviating from the scope and spirit of the appended claims. It should also be understood that the sequence of method steps in the flowcharts presented above is not mandatory, also alternative sequences may be possible.

The invention claimed is:

1. An apparatus comprising:
a switch driver to cause, based on an input signal, switching of a plurality of switches; and
a differential driver comprising the plurality of switches coupled to at least two transmission lines to create a differential interface for sending digital data, wherein when the plurality of switches are switched, the differential driver generates at least one differential signal having rise and fall times, wherein the rise and fall times are determined by at least a switching time of the plurality of switches, wherein decreasing the rise and fall times to a range of times causes a reduction of a noise that is common to the at least two transmission lines, wherein each of the at least two transmission lines comprises a signal conductor, wherein the at least two transmission lines share a ground-plane, wherein the shared ground-plane is formed in a predetermined pattern to cause a reduction in amplitudes of frequency components of the noise above a predetermined frequency, and wherein the rise and fall times reduce amplitudes of frequency components of the noise below the predetermined frequency.

2. The apparatus according to claim 1, wherein the range of times includes one or more of:
10 picoseconds to 30 picoseconds;
10 picoseconds to 20 picoseconds;
5 picoseconds to 20 picoseconds; or
less than 15 picoseconds.

3. The apparatus according to claim 1, wherein the at least one differential signal comprises at least one of a serial digital data transmission or a parallel digital data transmission.

4. The apparatus according to claim 1, wherein the apparatus comprises a mobile terminal.

5. The apparatus according to claim 1, wherein the predetermined frequency has a value of about 3 Gigahertz.

6. The apparatus according to claim 1, wherein the plurality of switches comprise:
- a first high-side switch connected to a first high-side impedance element and a first low-side switch connected to a first low-side impedance element, wherein the first high-side impedance element and the first low-side impedance element are further connected to a first differential output; and
- a second high-side switch connected to a second high-side impedance element and a second low-side switch connected to a second low-side impedance element, wherein the second high-side impedance element and the second low-side impedance element are further connected to a second differential output,
- wherein a first control input to the first high-side switch and a second control input to the second low-side switch are connected to a first input, and wherein a third control input to the second high-side switch and a fourth control input to the first low-side switch are connected to a second input.

7. The apparatus according to claim 6, wherein at least one of the first high-side switch, the second high-side switch, the first low-side switch, or the second low-side switch comprises at least one of a resonance tunnel diode or a transistor.

8. The apparatus according to claim 1, wherein the ground-plane comprises a defected ground-plane filter including carbon nanotube material.

9. The apparatus according to claim 8, wherein the defected ground filter has a product of relative permeability and permittivity of at least 5000 at the predetermined frequency.

10. The apparatus according to claim 1, wherein the defected ground-plane filter is implemented in a connector incorporated into the apparatus.

11. The apparatus according to claim 1, wherein the rise and fall times are less than or equal to 35 picoseconds.

12. The apparatus according to claim 1, wherein each of the plurality of switches includes an impedance element to cause impedance matching between the differential driver and the at least two transmission lines.

13. A method comprising:
- generating, by a switch driver, one or more control signals to cause, based on an input signal, switching of a plurality of switches; and
- generating, by a differential driver comprising the plurality of switches coupled to at least two transmission lines to create a differential interface for sending digital data, when the plurality of switches are switched, at least one differential signal having rise and fall times, wherein the rise and fall times are determined by at least a switching time of the plurality of switches, wherein decreasing the rise and fall times to a range of times causes a reduction of a noise that is common to the at least two transmission lines, wherein each of the at least two transmission lines comprises a signal conductor, wherein the at least two transmission lines share a ground-plane, wherein the shared ground-plane is formed in a predetermined pattern to cause a reduction in amplitudes of frequency components of the noise above a predetermined frequency, and wherein the rise and fall times reduce amplitudes of frequency components of the noise below the predetermined frequency.

14. The method according to claim 13, wherein the range of times includes one or more of:
- 10 picoseconds to 30 picoseconds;
- 10 picoseconds to 20 picoseconds;
- 5 picoseconds to 20 picoseconds; or
- less than 15 picoseconds.

15. The method according to claim 13, wherein the at least one differential signal comprises at least one of a serial digital data transmission or a parallel digital data transmission.

16. The method according to claim 13, wherein the method is implemented in a mobile terminal.

17. The method according to claim 13, wherein the predetermined frequency has a value of about 3 Gigahertz.

18. The method according to claim 13, wherein the plurality of switches comprise:
- a first high-side switch connected to a first high-side impedance element and a first low-side switch connected to a first low-side impedance element, wherein the first high-side impedance element and the first low-side impedance element are further connected to a first differential output; and
- a second high-side switch connected to a second high-side impedance element and a second low-side switch connected to a second low-side impedance element, wherein the second high-side impedance element and the second low-side impedance element are further connected to a second differential output,
- wherein a first control input to the first high-side switch and a second control input to the second low-side switch are connected to a first input, and wherein a third control input to the second high-side switch and a fourth control input to the first low-side switch are connected to a second input.

19. The method according to claim 18, wherein at least one of the first high-side switch, the second high-side switch, the first low-side switch, or the second low-side switch comprises at least one of a resonance tunnel diode or a transistor.

20. The method according to claim 13, wherein the ground-plane comprises a defected ground-plane filter including carbon nanotube material.

21. The method according to claim 20, wherein the defected ground filter has a product of relative permeability and permittivity at least 5000 at the predetermined frequency.

22. The method according to claim 20, wherein the defected ground filter is implemented in a connector incorporated into an apparatus.

23. The method according to claim 13, wherein the rise and fall times are less than or equal to 35 picoseconds.

24. The method according to claim 13, wherein each of the plurality of switches includes an impedance element to cause impedance matching between the differential driver and the at least two transmission lines.

25. A non-transitory computer-readable medium encoded with instructions that, when executed by at least one processor, cause operations comprising:
- generating, by a switch driver, one or more control signals to cause, based on an input signal, switching of a plurality of switches; and
- generating, by a differential driver comprising the plurality of switches coupled to at least two transmission lines to create a differential interface for sending digital data, when the plurality of switches are switched, at least one differential signal having rise and fall times, wherein the rise and fall times are determined by at least a switching time of the plurality of switches, wherein decreasing the rise and fall times to less than or equal to 35 picoseconds causes a reduction of a noise that is common to the at least two transmission lines, and wherein each of the plurality of switches includes an impedance element to cause impedance matching between the differential driver and the at least two transmission lines,
- wherein each of the at least two transmission lines comprises a signal conductor, wherein the at least two transmission lines share a ground-plane, wherein the shared ground-plane is formed in a predetermined pattern to cause a reduction in amplitudes of frequency components of the noise above a about 3 Gigahertz, and wherein the rise and fall times reduce amplitudes of frequency components of the noise below about 3 Gigahertz.

* * * * *